United States Patent
Tabata et al.

(10) Patent No.: US 11,796,914 B2
(45) Date of Patent: Oct. 24, 2023

(54) PHOTOSENSITIVE RESIN STRUCTURE FOR PRINTING PLATE, AND METHOD FOR PRODUCING SAME

(71) Applicant: ASAHI KASEI KABUSHIKI KAISHA, Tokyo (JP)

(72) Inventors: Shusaku Tabata, Tokyo (JP); Masaki Matsumoto, Tokyo (JP); Ryo Ichihashi, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 282 days.

(21) Appl. No.: 16/632,021

(22) PCT Filed: Jul. 20, 2018

(86) PCT No.: PCT/JP2018/027286
§ 371 (c)(1),
(2) Date: Jan. 17, 2020

(87) PCT Pub. No.: WO2019/017474
PCT Pub. Date: Jan. 24, 2019

(65) Prior Publication Data
US 2020/0150533 A1  May 14, 2020

(30) Foreign Application Priority Data

Jul. 20, 2017 (JP) .................... 2017-140762
Oct. 25, 2017 (JP) .................... 2017-205954
Feb. 5, 2018 (JP) .................... 2018-018523

(51) Int. Cl.
| | | |
|---|---|---|
| G03F 7/09 | (2006.01) | |
| B41C 1/10 | (2006.01) | |
| C08L 53/02 | (2006.01) | |
| C08L 75/04 | (2006.01) | |
| C08L 77/00 | (2006.01) | |
| G03F 7/031 | (2006.01) | |
| G03F 7/11 | (2006.01) | |

(52) U.S. Cl.
CPC .............. *G03F 7/091* (2013.01); *B41C 1/10* (2013.01); *C08L 53/02* (2013.01); *C08L 75/04* (2013.01); *C08L 77/00* (2013.01); *G03F 7/031* (2013.01); *G03F 7/11* (2013.01)

(58) Field of Classification Search
CPC .................................................. G03F 7/20
See application file for complete search history.

(56) References Cited

U.S. PATENT DOCUMENTS

| | | | |
|---|---|---|---|
| 5,262,275 A | 11/1993 | Fan | |
| 5,919,601 A | 7/1999 | Nguyen et al. | |
| 6,284,431 B1 * | 9/2001 | Tanizaki | G03F 7/202 |
| | | | 430/944 |
| 2003/0180655 A1 | 9/2003 | Fan et al. | |
| 2003/0211419 A1 | 11/2003 | Fan | |
| 2004/0187719 A1 | 9/2004 | Knoell et al. | |
| 2006/0051701 A1 | 3/2006 | Taguchi et al. | |
| 2006/0185542 A1 | 8/2006 | Hayashi | |
| 2006/0213881 A1 | 9/2006 | Oliphant et al. | |
| 2009/0110887 A1 | 4/2009 | Sanada et al. | |
| 2009/0233221 A1 | 9/2009 | Kanchiku et al. | |
| 2010/0075260 A1 | 3/2010 | Sasaki | |
| 2010/0167202 A1 | 7/2010 | Yoshimoto et al. | |
| 2010/0297559 A1 | 11/2010 | Hata | |
| 2011/0200943 A1 | 8/2011 | Aoshima | |
| 2011/0275016 A1 | 11/2011 | Iso | |
| 2012/0052444 A1 | 3/2012 | Iwai | |
| 2012/0052445 A1 | 3/2012 | Taguchi et al. | |
| 2012/0111211 A1 | 5/2012 | Yawata et al. | |
| 2012/0288682 A1 | 11/2012 | Inoue et al. | |
| 2013/0260121 A1 | 10/2013 | Inoue et al. | |
| 2014/0322646 A1 | 10/2014 | Nakash et al. | |
| 2014/0370440 A1 | 12/2014 | Yamada et al. | |

(Continued)

FOREIGN PATENT DOCUMENTS

| | | |
|---|---|---|
| CN | 1362903 A | 8/2002 |
| CN | 1509869 A | 7/2004 |
| CN | 1599883 A | 3/2005 |

(Continued)

OTHER PUBLICATIONS

European Search Report, European Patent Office, Application No. 18835528.3, dated Jul. 20, 2020.

(Continued)

*Primary Examiner* — Chanceity N Robinson
(74) *Attorney, Agent, or Firm* — GREENBLUM & BERNSTEIN, P.L.C.

(57) ABSTRACT

A photosensitive resin structure for a printing plate, containing:

a support (A);

a photosensitive resin composition layer (B) comprising a thermoplastic elastomer (B-1) comprising a monovinyl-substituted aromatic hydrocarbon and a conjugated diene, an ethylenically unsaturated compound (B-2), and a photopolymerization initiator (B-3); and a non-infrared ray-shielding layer (C) ablatable with an infrared ray, wherein the non-infrared ray-shielding layer (C) comprises a polymer (C-2) having a carboxylate group and an ester bond group in a molecule thereof and an infrared ray absorber (C-3), and a proportion of an ester bond group such that carbon bonded to the ester bond group and carbon bonded to the carboxylate group are adjacent to each other in all the ester bond groups contained in the polymer (C-2) is 15% or more.

15 Claims, No Drawings

(56) References Cited

U.S. PATENT DOCUMENTS

2015/0241770 A1* 8/2015 Yoshida .................. G03F 7/11
                                                        430/288.1
2021/0229480 A1* 7/2021 Nakagawa ............. G03F 7/075

FOREIGN PATENT DOCUMENTS

| CN | 1767956   | A | 5/2006  |
|----|-----------|---|---------|
| CN | 1898056   | A | 1/2007  |
| CN | 101218108 | A | 7/2008  |
| CN | 101713913 | A | 5/2010  |
| CN | 101978321 | A | 2/2011  |
| CN | 102124410 | A | 7/2011  |
| CN | 102385245 | A | 3/2012  |
| CN | 102792223 | A | 11/2012 |
| CN | 103261965 | A | 8/2013  |
| CN | 104246604 | A | 12/2014 |
| CN | 104298070 | A | 1/2015  |
| CN | 106066579 | A | 11/2016 |
| JP | 04-204447 |   | 7/1992  |
| JP | 08-305030 |   | 11/1996 |
| JP | 2773981   |   | 7/1998  |
| JP | 11-153865 |   | 6/1999  |
| JP | 2000-066009 | A | 3/2000 |
| JP | 2002-357907 |   | 12/2002 |
| JP | 2003-43672  |   | 2/2003  |
| JP | 2003-098652 |   | 4/2003  |
| JP | 2006-163284 | A | 6/2006 |
| JP | 2009-244835 | A | 10/2009 |
| JP | 2009-300588 |   | 12/2009 |
| JP | 2010-069857 | A | 4/2010 |
| JP | 4610132     |   | 1/2011  |
| JP | 2012-068423 |   | 4/2012  |
| JP | 2012068423  | A | * 4/2012 |
| JP | 2013-101394 |   | 5/2013  |
| JP | 2015-011330 |   | 1/2015  |
| JP | 2015-121652 |   | 7/2015  |
| KR | 2016-0036916 | A | 4/2016 |
| WO | 2015/002207 |   | 1/2015  |
| WO | 2017/170573 |   | 10/2017 |
| WO | 2018/056211 |   | 3/2018  |

OTHER PUBLICATIONS

ISR issued in International Patent Application No. PCT/JP2018/027286, dated Oct. 23, 2018, English Translation.

IPRP issued in International Patent Application No. PCT/JP2018/027286, dated Jan. 21, 2020, English Translation.

* cited by examiner

PHOTOSENSITIVE RESIN STRUCTURE FOR PRINTING PLATE, AND METHOD FOR PRODUCING SAME

TECHNICAL FIELD

The present invention relates to a photosensitive resin structure for a printing plate, and a method for producing the same.

BACKGROUND ART

As a printing system, a system that enables printing by forming a three dimensional shape on a printing plate and a system that enables printing by imparting a chemical characteristic to a printing plate have been known, and representative examples of the former include letterpress printing and intaglio printing.

In the letterpress printing, adhesion of an ink to a protruded portion of a printing plate enables printing, and on the other hand, in the intaglio printing, adhesion of an ink to a recessed portion of a printing plate enables printing.

A printing plate for use in the letterpress printing, particularly a printing plate for use in flexographic printing, which is one of the letterpress printing methods, is generally made of a photosensitive resin structure obtained by laminating a photosensitive resin composition layer on a polyester film as a support.

Methods for obtaining a printing plate by making a photosensitive resin plate for a printing plate using this photosensitive resin structure include the following method.

First, the whole surface of a photosensitive resin structure is subjected to ultraviolet ray exposure through a polyester film as a support of the photosensitive resin structure (back exposure) to provide a thin, uniform cured layer. Subsequently, a negative film is disposed on the photosensitive resin composition layer, and image exposure (relief exposure) is performed on the photosensitive resin composition layer through the negative film to photo-cure the photosensitive resin composition layer according to the pattern of the negative film. Thereafter, unexposed portions (that is, uncured portions) in the photosensitive resin composition layer are washed with a developing solution to form a desired image, that is, a relief image, thereby obtaining a photosensitive resin plate for a printing plate, and a predetermined finishing treatment is subsequently performed to obtain a printing plate.

In recent years, enhancement of precision in flexographic printing machines has progressed, so that enhancement of resolution has been required in flexographic printing plates, and particularly in halftone dot printing in which light and shade of printed matter is expressed by the size of halftone dots, improvements in fineness of halftone dots by which the light and shade can be presented have been required.

As a value showing the extent of this fineness of the halftone dots, there is a numerical value expressed by the number of halftone dots disposed per inch. As a unit of this number of halftone dots, a line (line/inch) is used, and resolution with high number of lines (lines/inch) has been required in a printing plate in order to achieve enhancement of resolution of the printing plate.

In growing demand for print quality in recent years, a technique in which a thin film that is ablatable with infrared laser is provided in place of a conventional negative film, and a portion to be cured with an ultraviolet ray and a portion not to be cured with an ultraviolet ray are provided by performing laser ablation has been developed, and the usage ratio thereof is increasing. Further, with the increase in the usage ratio thereof, requirements in the operability in addition to the print quality have been increasing.

In view of the requirements in the print quality and the operability, as described above, various techniques have conventionally been proposed on a flexographic printing plate (for example, see Patent Literatures 1 to 5).

Patent Literature 1 describes a photosensitive resin structure wherein an infrared ray ablation layer and a photosensitive resin layer are non-compatible.

Patent Literature 2 proposes a photosensitive resin structure using a copolymer of a monovinyl-substituted aromatic hydrocarbon and a conjugated diene as a binder resin for an infrared ray ablation layer.

Patent Literature 3 proposes a photosensitive resin plate having a slip layer and proposed that the slip layer is composed of a polyamide and a thermoplastic elastomer.

Patent Literature 4 proposes a printing original plate having a heat-sensitive mask layer and proposes that the heat-sensitive mask layer contains a butyral resin and a polar group-containing polyamide.

Patent Literature 5 proposes a composition for an infrared ray ablation layer and proposes that a composition containing a (meth)acrylic resin, an elastomer, and a fatty acid amide as the composition for an infrared ray ablation layer.

CITATION LIST

Patent Literature

Patent Literature 1
Japanese Patent Laid-Open No. 8-305030
Patent Literature 2
Japanese Patent Laid-Open No. 11-153865
Patent Literature 3
Japanese Patent Laid-Open No. 2003-43672
Patent Literature 4
Japanese Patent Laid-Open No. 2009-300588
Patent Literature 5
Japanese Patent Laid-Open No. 2015-121652

SUMMARY OF INVENTION

Technical Problem

However, the infrared ray ablation layer described in Patent Literature 1 has a low compatibility with the photosensitive resin layer, and therefore the adhesion between the infrared ray ablation layer and the photosensitive resin layer is low, so that the infrared ray ablation layer has the following handling problem: the infrared ray ablation layer peels off the photosensitive resin layer at the time of handling a plate.

The photosensitive resin structure described in Patent Literature 2 uses a copolymer made from a monovinyl-substituted aromatic hydrocarbon and a conjugated diene as a binder for an infrared ray ablation layer, and therefore the adhesion between the infrared ray ablation layer and the photosensitive resin layer is good, but on the other hand, the photosensitive resin structure has the following handling problem: the adhesive force between a cover film provided on the infrared ray ablation layer on the opposite side of the photosensitive resin layer-forming surface side and the infrared ray ablation layer is weak.

In the photosensitive resin plate described in Patent Literature 3, it has been proposed that a polyamide and a thermoplastic elastomer are used as materials for the slip layer, but any study has not been conducted at all on the adhesive force between the slip layer and the photosensitive resin layer and the handling properties on the slip layer, so that the photosensitive resin plate has the following problem: there is room for improvements.

Each of Patent Literatures 4 and 5 proposes a composition on an infrared ray ablation layer, but any study has not been conducted at all on the handling properties of the infrared ray ablation layer, so that the composition has the following problem: there is room for improvements.

Thus, in view of the above-described problems of the conventional techniques, an object of the present invention is to provide a photosensitive resin structure for a printing plate, the photosensitive resin structure having a non-infrared ray-shielding layer having a sufficient adhesion to a photosensitive resin composition layer, also having a good adhesion to a cover film to be laminated on the surface of the infrared ray ablation layer on the opposite side of the photosensitive resin composition layer-forming surface, namely on the surface of the non-infrared ray-shielding layer, and having a high optical density.

Solution to Problem

The present inventors have conducted diligent studies on a photosensitive resin plate for a printing plate, having a support, a photosensitive resin composition layer, and a non-infrared ray-shielding layer in order to solve the problems to find that by specifying the composition of the photosensitive resin composition layer and the composition of the non-infrared ray-shielding layer, the above-described problems of the conventional techniques can be solved, and thereby completed the present invention.

That is, the present invention is as follows.

[1]

A photosensitive resin structure for a printing plate, comprising:

a support (A);

a photosensitive resin composition layer (B) comprising a thermoplastic elastomer (B-1) comprising a monovinyl-substituted aromatic hydrocarbon and a conjugated diene, an ethylenically unsaturated compound (B-2), and a photopolymerization initiator (B-3); and a non-infrared ray-shielding layer (C) ablatable with an infrared ray, wherein the non-infrared ray-shielding layer (C) comprises a polymer (C-2) having a carboxylate group and an ester bond group in a molecule thereof and an infrared ray absorber (C-3), and a proportion of an ester bond group such that carbon bonded to the ester bond group and carbon bonded to a carboxylate group are adjacent to each other in all ester bond groups contained in the polymer (C-2) is 15% or more.

[2]

The photosensitive resin structure for the printing plate according to [1], wherein the ester bond group contained in the polymer (C-2) has a saturated hydrocarbon chain.

[3]

The photosensitive resin structure for the printing plate according to [1] or [2], wherein the polymer (C-2) comprises an aromatic hydrocarbon group.

[4]

The photosensitive resin structure for the printing plate according to [3], wherein the aromatic hydrocarbon group contained in the polymer (C-2) comprises a polymer of a monovinyl-substituted aromatic hydrocarbon.

[5]

The photosensitive resin structure for the printing plate according to any one of [1] to [4], wherein the non-infrared ray-shielding layer (C) further comprises a polyamide resin (C-1).

[6]

The photosensitive resin structure for the printing plate according to [5], wherein a mass ratio of the polyamide resin (C-1) to the infrared ray absorber (C-3) is (C-1):(C-3)=1:0.15 to 2.

[7]

The photosensitive resin structure for the printing plate according to [5] or [6], wherein a mass ratio of the polyamide resin (C-1) to the polymer (C-2) is (C-1):(C-2)=1:0.0001 to 3.

[8]

The photosensitive resin structure for the printing plate according to any one of [5] to [7], wherein a mass ratio of the polyamide resin (C-1) to the polymer (C-2) is (C-1):(C-2)=1:0.001 to 1.

[9]

The photosensitive resin structure for the printing plate according to any one of [1] to [8], wherein the photosensitive resin structure for the printing plate comprises 10 to 80% by mass of the infrared ray absorber (C-3) in the non-infrared ray-shielding layer (C).

[10]

The photosensitive resin structure for the printing plate according to any one of [1] to [9], wherein the polymer (C-2) has a number average molecular weight of 500 or more.

[11]

The photosensitive resin structure for the printing plate according to any one of [1] to [10], wherein the photosensitive resin structure for the printing plate comprises a particle layer (D) between the non-infrared ray-shielding layer (C) and the photosensitive resin composition layer (B), the particle layer (D) comprises a particle having a pore structure, and the particle having a pore structure has a specific surface area of 350 $m^2/g$ or more and 1000 $m^2/g$ or less.

[12]

The photosensitive resin structure for the printing plate according to any one of [1] to [11], wherein the photosensitive resin structure for the printing plate comprises an intermediate layer (E) between the non-infrared ray-shielding layer (C) and the photosensitive resin composition layer (B).

[13]

The photosensitive resin structure for the printing plate according to [12], wherein the intermediate layer (E) comprises a polyamide resin.

[14]

The photosensitive resin structure for the printing plate according to [12] or [13], wherein a content of the thermoplastic elastomer (B-1) comprising a monovinyl-substituted aromatic hydrocarbon and a conjugated diene is 40% by mass or more, based on a whole amount of the photosensitive resin composition.

[15]

The photosensitive resin structure for the printing plate according to [13] or [14], wherein the polyamide resin is a water-soluble polyamide.

[16]

The photosensitive resin structure for the printing plate according to [15], wherein the water-soluble polyamide comprises a hydrophilic group.

[17]

The photosensitive resin structure for the printing plate according to [15] or [16], wherein the water-soluble polyamide comprises a dimethylamino group or an alkoxymethyl group.

[18]

The photosensitive resin structure for the printing plate according to any one of [15] to [17], wherein a proportion of the water-soluble polyamide contained in the intermediate layer (E) is 30% by mass or more, based on a whole amount of the intermediate layer.

[19]

The photosensitive resin structure for the printing plate according to any one of [12] to [18], wherein the intermediate layer (E) comprises a polyurethane.

[20]

The photosensitive resin structure for the printing plate according to [19], wherein a proportion of the polyurethane contained in the intermediate layer (E) is 0.5% by mass or more and 70% by mass or less, based on a whole amount of the intermediate layer.

[21]

The photosensitive resin structure for the printing plate according to any one of [12] to [20], wherein the photopolymerization initiator (B-3) comprises at least one photopolymerization initiator having a structure represented by following formula (b-1) and at least one photopolymerization initiator having a structure represented by following formula (b-2):

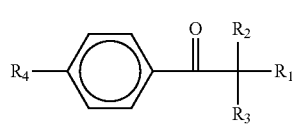

(b-1)

wherein $R_1$ to $R_4$ each independently represent one selected from the group consisting of a hydrogen atom, a hydrocarbon group having 1 to 10 carbon atoms, and a hetero group having 1 to 9 carbon atoms, the hetero group having 1 to 9 carbon atoms comprising any of an oxygen atom, a nitrogen atom, and a sulfur atom;

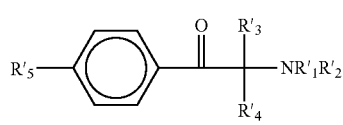

(b-2)

wherein $R'_1$ to $R'_5$ each independently represent one selected from the group consisting of a hydrogen atom, a hydrocarbon group having 1 to 10 carbon atoms, and a hetero group having 1 to 9 carbon atoms, the hetero group having 1 to 9 carbon atoms comprising any of an oxygen atom, a nitrogen atom, and a sulfur atom.

[22]

The photosensitive resin structure for the printing plate according to [21], wherein $R_1$ in the formula (b-1) represents a hydrocarbon group comprising an aromatic ring.

[23]

The photosensitive resin structure for the printing plate according to [21] or [22], wherein $R_2$ and/or $R_3$ in the formula (b-1) represents an alkoxy group.

[24]

The photosensitive resin structure for the printing plate according to any one of [21] to [23], wherein $R_2$ and/or $R_3$ in the formula (b-1) represents a methoxy group.

[25]

The photosensitive resin structure for the printing plate according to any one of [21] to [24], wherein $R'_5$ in the formula (b-2) represents a hetero functional group comprising a nitrogen atom or a sulfur atom.

[26]

The photosensitive resin structure for the printing plate according to any one of [12] to [25], wherein the intermediate layer (E) comprises a dimer acid-based thermoplastic polyamide.

[27]

The photosensitive resin structure for the printing plate according to any one of [12] to [26], wherein the intermediate layer (C) has a thickness of 0.5 µm or more and 20 µm or less.

[28]

The photosensitive resin structure for the printing plate according to any one of [12] to [27], wherein the intermediate layer (E) comprises a dye.

[29]

The photosensitive resin structure for the printing plate according to any one of [12] to [28], wherein the intermediate layer (C) has an ultraviolet ray transmittance at a wavelength of 365 nm of 40% or more.

[30]

A method for producing a photosensitive resin structure for a printing plate, the photosensitive resin structure comprising:

a support (A);

a photosensitive resin composition layer (B) comprising a thermoplastic elastomer (B-1) comprising a monovinyl-substituted aromatic hydrocarbon and a conjugated diene, an ethylenically unsaturated compound (B-2), and a photopolymerization initiator (B-3); and a non-infrared ray-shielding layer (C) ablatable with an infrared ray, wherein the non-infrared ray-shielding layer (C) is formed by applying a coating liquid comprising an infrared ray absorber (C-3) having a median diameter of 0.2 to 0.3 µm.

[31]

The photosensitive resin structure for the printing plate according to any one of [1] to [29], wherein a proportion of an area of the infrared ray absorber (C-3) in a section of the non-infrared ray-shielding layer (C) is 50% or more.

Advantageous Effects of Invention

The present invention can provide a photosensitive resin structure for a printing plate, the photosensitive resin structure having a non-infrared ray-shielding layer having a sufficient adhesion to a photosensitive resin composition layer, also having a good adhesion to a cover film to be laminated on the surface of the non-infrared ray-shielding layer on the opposite side of the photosensitive resin composition layer-forming surface side, and having an improved optical density.

DESCRIPTION OF EMBODIMENT

Hereinafter, an embodiment for carrying out the present invention (hereinafter, referred to as "present embodiment") will be described in detail.

The present invention is not limited to the description below and can be carried out by being modified variously within the range of the scope thereof.

[Photosensitive Resin Structure for Printing Plate]

A photosensitive resin structure for a printing plate according to the present embodiment is a photosensitive resin structure for a printing plate, having:

a support (A);

a photosensitive resin composition layer (B) containing a thermoplastic elastomer (B-1) containing a monovinyl-substituted aromatic hydrocarbon and a conjugated diene, an ethylenically unsaturated compound (B-2), and a photopolymerization initiator (B-3); and a non-infrared ray-shielding layer (C) ablatable with an infrared ray, wherein the non-infrared ray-shielding layer (C) contains a polymer (C-2) having a carboxylate group and an ester bond group in a molecule thereof and an infrared ray absorber (C-3), and a proportion of an ester bond group such that carbon bonded to the ester bond group and carbon bonded to the carboxylate group are adjacent to each other in all the ester bond groups contained in the polymer (C-2) is 15% or more.

The proportion of the ester bond group such that carbon bonded to the carboxylate group and carbon bonded to the ester bond group are adjacent to each other in all the ester bond group can be measured using 13C-NMR, as will be described later.

(Support (A))

Examples of the support (A) include, but not limited to, a polyester film.

Examples of the polyester include polyethylene terephthalate, polybutylene terephthalate, and polyethylene naphthalate.

Also, the thickness of the support (A) is not particularly limited, and a film of 50 to 300 μm is given as an example.

An adhesive layer may be provided on the support (A) in order to enhance the adhesive force between the support (A) and the photosensitive resin composition layer (B) which will be described later, and examples of the adhesive layer include the adhesive layer described in International Publication No. WO 2004/104701.

(Photosensitive Resin Composition Layer (B))

The photosensitive resin composition layer (B) contains a thermoplastic elastomer (B-1), an ethylenically unsaturated compound (B-2), and a photopolymerization initiator (B-3), which will be described later, and, if necessary, may further contain an auxiliary additive component.

<Thermoplastic Elastomer (B-1)>

The photosensitive resin composition layer (B) contains a thermoplastic elastomer (B-1) containing a monovinyl-substituted aromatic hydrocarbon and a conjugated diene.

The thermoplastic elastomer (B-1) is preferably a thermoplastic elastomer (B-1) having a polymer block formed from a monovinyl-substituted aromatic hydrocarbon and a polymer block formed from a conjugated diene.

Examples of the monovinyl-substituted aromatic hydrocarbon that constitutes the thermoplastic elastomer (B-1) include, but not limited to, styrene, t-butylstyrene, divinylbenzene, 1,1-diphenylstyrene, N,N-dimethyl-p-aminoethylstyrene, N,N-diethyl-p-aminoethylstyrene, vinylpyridine, p-methylstyrene, p-methoxystyrene, tertiary-butylstyrene, α-methylstyrene, and 1,1-diphenylethylene.

Particularly, styrene is preferable from the viewpoint of enabling the photosensitive resin composition layer (B) to be formed so as to be flat at a relatively low temperature.

These may be used singly or in combinations of two or more thereof.

Examples of the conjugated diene that constitutes the thermoplastic elastomer (B-1) include, but not limited to, butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene, and chloroprene.

These may be used singly or in combinations of two or more thereof.

From the viewpoint of durability of the photosensitive resin structure for a printing plate according to the present embodiment, butadiene is preferable as the conjugated diene.

The thermoplastic elastomer (B-1) preferably has a number average molecular weight of 20,000 to 300,000, and more preferably 50,000 to 200,000 from the viewpoint of viscosity at normal temperature.

The number average molecular weight can be measured by gel permeation chromatography (GPC) and is expressed by a molecular weight in terms of polystyrene.

When the thermoplastic elastomer (B-1) is a block copolymer having a polymer block formed from a monovinyl-substituted aromatic hydrocarbon and a polymer block formed from a conjugated diene, examples of the block copolymer that constitutes the thermoplastic elastomer (B-1) include linear block copolymers represented by the following formula group (I) and/or linear block copolymers or radial block copolymers represented by the following formula group (II).

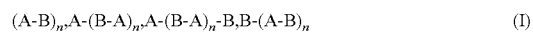

$$(A-B)_n, A-(B-A)_n, A-(B-A)_n-B, B-(A-B)_n \qquad (I)$$

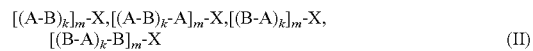

$$[(A-B)_k]_m-X, [(A-B)_k-A]_m-X, [(B-A)_k]_m-X,$$
$$[(B-A)_k-B]_m-X \qquad (II)$$

A represents a monovinyl-substituted aromatic hydrocarbon.

B represents a conjugated diene.

X represents a residual group of a coupling agent such as, for example, silicon tetrachloride, tin tetrachloride, epoxidized soybean oil, a poly(halogenated hydrocarbon) compound, a carboxylic acid ester compound, a polyvinyl compound, a bisphenol type epoxy compound, an alkoxysilane compound, a halogenated silane compound, or an ester-based compound, or a residual group of an initiator such as a multifunctional organolithium compound.

n, k, and m each represent an integer of at least one, for example, 1 to 5.

The content of the conjugated diene and of the monovinyl-substituted aromatic hydrocarbon in the thermoplastic elastomer (B-1) can be measured using a nuclear magnetic resonance apparatus ($^1$H-NMR).

Specifically, the contents can be measured by using JNM-LA400 (manufactured by JEOL Ltd., trade name) as a $^1$H-NMR measurement device, using deuterated chloroform as a solvent, setting the sample concentration to 50 mg/mL, setting a measurement frequency at 400 MHz, using TMS (tetramethylsilane) as a standard of chemical shifts, and setting a pulse delay to 2.904 seconds, the number of times of scanning to 64, a pulse width to 45°, and a measurement temperature to 25° C.

The copolymerization ratio (mass ratio) of the monovinyl-substituted aromatic hydrocarbon to the conjugated diene in the thermoplastic elastomer (B-1) is preferably monovinyl-substituted aromatic hydrocarbon/conjugated diene=10/80 to 90/20, more preferably 10/90 to 85/15, and still more preferably 10/90 to 60/40 from the viewpoint of the hardness of the photosensitive resin composition layer that constitutes a printing plate.

When the proportion of the monovinyl-substituted aromatic hydrocarbon is 10 or more, a sufficient hardness is obtained in the photosensitive resin composition layer (B), so that appropriate printing can be performed by usual printing pressure. When the proportion is 90 or less, an appropriate hardness is obtained in the photosensitive resin composition layer (B), so that inks can be transferred to an object of printing sufficiently in the printing process.

If necessary, another functional group may be introduced, a chemical modification such as hydrogenation may be performed, or another component may be copolymerized in the thermoplastic elastomer (B-1).

The content of the thermoplastic elastomer (B-1) in the photosensitive resin composition layer (B) is preferably 40% by mass or more, more preferably 40 to 80% by mass, still more preferably 45 to 80% by mass, and further still more preferably 45 to 75% by mass when the whole amount of the photosensitive resin composition is assumed to be 100% by mass from the viewpoint of durability of a photosensitive resin plate for a printing plate, and a printing plate each obtained using the photosensitive resin structure for a printing plate according to the present embodiment.

<Ethylenically Unsaturated Compound (B-2)>

The photosensitive resin composition layer (B) contains an ethylenically unsaturated compound (B-2).

The ethylenically unsaturated compound (B-2) refers to a compound having a radically polymerizable unsaturated double bond.

Examples of the ethylenically unsaturated compound (B-2) include, but not limited to, olefins such as ethylene, propylene, vinyltoluene, styrene, and divinylbenzene; acetylenes; (meth)acrylic acid and/or derivatives thereof; haloolefins; unsaturated nitriles such as acrylonitrile; derivatives of acrylamide or methacrylamide; unsaturated dicarboxylic acids and derivatives thereof such as maleic anhydride, maleic acid, and fumaric acid; vinyl acetates; N-vinylpyrrolidone; N-vinylcarbazole; and N-substituted male imide compounds.

Particularly, (meth)acrylic acid and/or derivatives thereof are preferable from the viewpoint of rich in variety.

Examples of the derivatives include, but not limited to, an alicyclic compound having a cycloalkyl group, a bicycloalkyl group, a cycloalkenyl group, a bicycloalkenyl group, or the like; an aromatic compound having a benzyl group, a phenyl group, a phenoxy group, a naphthalene skeleton, an anthracene skeleton, a biphenyl skeleton, a phenanthrene skeleton, a fluorene skeleton, or the like; a compound having an alkyl group, a halogenated alkyl group, an alkoxyalkyl group, a hydroxyalkyl group, an aminoalkyl group, a glycidyl group, or the like; an ester compound with a polyhydric alcohol such as an alkylene glycol, a polyoxyalkylene glycol, a polyalkylene glycol, or trimethylolpropane; and a compound having a polysiloxane structure, such as polydimethylsiloxane and polydiethylsiloxane.

In addition, the derivative may be a heteroaromatic compound containing an element such as nitrogen or sulfur.

Examples of the (meth)acrylic acid and/or derivatives thereof include, but not limited to, a diacrylate and a dimethacrylate of an alkanediol such as hexanediol or nonanediol; a diacrylate and a dimethacrylate of ethylene glycol, diethylene glycol, propylene glycol, dipropylene glycol, polyethylene glycol, or butylene glycol; trimethylolpropane tri(meth)acrylate; dimethylol tricyclodecane di(meth)acrylate; isobornyl (meth)acylate; phenoxy polyethylene glycol (meth)acrylate; and pentaerythrit tetra(meth)acrylate.

These may be used singly or in combinations of two or more thereof.

From the viewpoint of the mechanical strength of a photosensitive resin plate for a printing plate, and a printing plate each obtained using the photosensitive resin structure for a printing plate according to the present embodiment, at least one (meth)acrylate is preferably used, and at least one bifunctional (meth)acrylate is more preferably used as the ethylenically unsaturated compound (B-2).

The ethylenically unsaturated compound (B-2) has a number average molecular weight (Mn) of preferably 100 or more from the viewpoint of securing nonvolatility, preferably less than 1000 from the viewpoint of compatibility with the other components such as a polymer, and more preferably 200 or more and 800 or less.

The content of the ethylenically unsaturated compound (B-2) in the photosensitive resin composition layer (B) is preferably set to 2% by mass to 30% by mass, more preferably set to 2% by mass to 25% by mass, and still more preferably set to 2% by mass to 20% by mass when the whole amount of the photosensitive resin composition is assumed to be 100% by mass in the production process for the photosensitive resin composition layer (B) from the viewpoint of printing durability of a printing plate obtained using the photosensitive resin structure for a printing plate according to the present embodiment.

<Photopolymerization Initiator (B-3)>

The photosensitive resin composition layer (B) contains a photopolymerization initiator (B-3).

The photopolymerization initiator (B-3) is a compound that absorbs the energy of light to produce a radical, and examples thereof include a degradable photopolymerization initiator, a hydrogen abstraction type photopolymerization initiator, and a compound having a site functioning as a hydrogen abstraction type photopolymerization initiator and a site functioning as a degradable photopolymerization initiator in the same molecule.

As the photopolymerization initiator (B-3), various organic carbonyl compounds, and particularly, aromatic carbonyl compounds are suitable.

The content of the photopolymerization initiator (B-3) in the photosensitive resin composition layer (B) is preferably set to a range of 0.1 to 10% by mass, more preferably set to a range of 0.1 to 5% by mass, and still more preferably set to a range of 0.5 to 5% by mass when the whole amount of the photosensitive resin composition is assumed to be 100% by mass in the production process for the photosensitive resin composition layer (B) from the viewpoint of print durability of a printing plate produced using the photosensitive resin structure for a printing plate according to the present embodiment.

Examples of the photopolymerization initiator (B-3) include, but not limited to, benzophenones such as benzophenone, 4,4-bis(diethylamino) benzophenone, 3,3',4,4'-benzophenone tetracarboxylic anhydride, and 3,3',4,4'-tetramethoxy benzophenone; anthraquinones such as t-butyl anthraquinone and 2-ethyl anthraquinone; thioxanthones such as 2,4-diethyl thioxanthone, isopropyl thioxanthone, and 2,4-dichloro thioxanthone; Michler's ketone; acetophenones such as diethoxyacetophenone, 2,2-dimethoxy-phenylacetophenone, 2-hydroxy-2-methyl-1-phenylpropan-1-one, benzyl dimethyl ketal, 1-hydroxycyclohexyl-phenyl ketone, 2-methyl-2-morpholino(4-thiomethylphenyl)propan-1-one, 2-methyl-1-(4-methylthiophenyl)-2-morpholinopropan-1-one, 2-benzyl-2-dimethylamino-1-(4-morpholinophenyl)-butanone, and acetophenones such as trichloroacetophenone; benzoin ethers such as benzoin methyl ether, benzoin ethyl ether, benzoin isopropyl ether, and benzoin isobutyl ether; acylphosphine oxides such as 2,4,6-trimethylbenzoyl diphenyl phosphine oxide, bis(2,6-dimethoxybenzoyl)-2,4,4-trimethyl pentyl phosphine oxide, and bis(2,4,6-trimethylbenzoyl)-phenyl phosphine oxide; methyl benzoylformate; 1,7-bisacridinyl heptane; 9-phenyl acridine; and azo compounds such as azobisisobutyronitrile, diazonium compounds, and tetrazene compounds.

These may be used singly or in combinations of two or more thereof.

The photosensitive resin composition layer (B) preferably contains, as the photopolymerization initiator (B-3), particularly at least one photopolymerization initiator having a structure represented by formula (b-1) and at least one photopolymerization initiator having a structure represented by formula (b-2).

[Photopolymerization Initiator having (b-1) Structure]

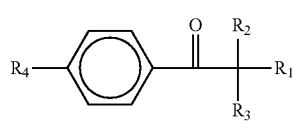

(b-1)

In the formula (b-1), $R_1$ to $R_4$ each independently represent one selected from the group consisting of a hydrogen atom, a hydrocarbon group having 1 to 10 carbon atoms, and a hetero group having 1 to 9 carbon atoms, the hetero group containing any of an oxygen atom, a nitrogen atom, and a sulfur atom.

$R_1$ to $R_4$ may each be the same or different, and may be cyclic.

$R_1$ is preferably a hydrocarbon group containing an aromatic ring in order to absorb the energy of light efficiently.

$R_2$ and/or $R_3$ is preferably an alkoxy group, and more preferably a methoxy group in order to produce a radical efficiently.

Examples of the photopolymerization initiator having a structure represented by formula (b-1) include 2,2-dimethoxy-phenylacetophenone.

[Photopolymerization Initiator having (b-2) Structure]

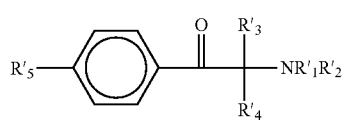

(b-2)

In the formula (b-2), $R'_1$ to $R'_5$ each independently represent one selected from the group consisting of a hydrogen atom, a hydrocarbon group having 1 to 10 carbon atoms, and a hetero group having 1 to 9 carbon atoms, the hetero group containing any of an oxygen atom, a nitrogen atom, and a sulfur atom.

$R'_1$ to $R'_5$ may each be the same or different, and may be cyclic.

From the viewpoint of producing a radical efficiently, $R'_5$ is preferably a hetero functional group containing a nitrogen atom or a sulfur atom.

Examples of the photopolymerization initiator having a structure represented by formula (b-2) include, but not limited to, 2-methyl-1-[4-(methylthio)phenyl]-2-(4-morpholinyl)-1-propanone and 2-benzyl-2-dimethylamino-4'-morpholinobutyrophenone.

These may be used singly or in combinations of two or more thereof.

If necessary, a predetermined liquid diene or auxiliary additive component may be contained in the photosensitive resin composition layer (B).

<Liquid Diene>

The liquid diene is a liquid compound having a carbon-carbon double bond.

In the present specification, "liquid" in the "liquid diene" means a characteristic having the property of being easily flow-deformable and capable of being solidified into a deformed shape by cooling, and is a term corresponding to an elastomer having the following property: when external force is applied, deformation occurs instantly depending on the external force, and when the external force is removed, the original shape is recovered in a short time.

Examples of the liquid diene include, but not limited to, liquid polybutadiene, liquid polyisoprene, a modified product of liquid polybutadiene, a modified product of liquid polyisoprene, a liquid acrylonitrile-butadiene copolymer, and a liquid styrene-butadiene copolymer.

The liquid diene is defined as a copolymer having a diene component of 50% by mass or more.

The number average molecular weight of the liquid diene is not particularly limited as long as it is liquid at 20° C., but is preferably 500 or more and 60000 or less, more preferably 500 or more and 50000 or less, and still more preferably 800 or more and 50000 or less from the viewpoint of the mechanical strength and handling properties of a photosensitive resin plate for a printing plate, and a printing plate each obtained using the photosensitive resin structure according to the present embodiment.

From the viewpoint of the mechanical properties of the photosensitive resin structure for a printing plate according to the present embodiment, and the mechanical properties of a photosensitive resin plate for a printing plate, and a printing plate each obtained using the same, liquid polybutadiene is preferable as the liquid diene.

The amount of a 1,2-vinyl bond in the liquid diene, preferably liquid polybutadiene, is preferably 1% or more and 80% or less, more preferably 5% or more and 70% or less, and still more preferably 5% or more and 65% or less from the viewpoint of making the hardness of the photosensitive resin structure for a printing plate according to the present embodiment, and the hardness of a photosensitive resin plate for a printing plate, and a printing plate each using the same appropriate.

The amount of the 1,2-vinyl bond is a proportion of a conjugated diene monomer incorporated by a 1,2-bond in conjugated diene monomers incorporated by bonding forms of the 1,2-bond, a 3,4-bond, and a 1,4-bond.

1,2-Polybutadiene, which is the liquid polybutadiene having the 1,2-vinyl bond, is highly reactive in radical polymerization and is preferable from the viewpoint of enhancing the hardness of the photosensitive resin composition layer (B) because vinyl, which has a double bond, forms a side chain.

The liquid polybutadiene is usually a mixture of 1,2-polybutadiene having the 1,2-vinyl bond and 1,4-polybutadiene having the 1,4-vinyl bond, and it is effective that 1,4-polybutadiene is contained in the liquid diene in order to improve the softness of the photosensitive resin structure for a printing plate according to the present embodiment, and the softness of a photosensitive resin plate for printing plate, and a printing plate each using the same. 1,4-Polybutadiene includes cis-1,4-polybutadiene and trans-1,4-polybutadiene. Any of cis- and trans-1,4-polybutadiene has a low reactivity in radical polymerization because a vinyl group, which has a double bond, exists inside, so that a soft resin can be produced finally.

When a plurality of liquid polybutadienes each having a different amount of the 1,2-vinyl bond are mixed and used, the average value of the amounts of the 1,2-vinyl bond is defined as the content of the 1,2-vinyl bond.

From the viewpoint of capable of adjusting the reactivity of the photosensitive resin composition easily, the whole amount of the 1,2-vinyl bond is preferably adjusted by mixing liquid polybutadiene having an amount of the 1,2-vinyl bond of 10% or less and liquid polybutadiene having an amount of the 1,2-vinyl bond of 80% or more. The whole amount of the 1,2-vinyl bond is preferably adjusted by mixing liquid polybutadiene having an amount of the 1,2-vinyl bond of more preferably 5% or less and liquid polybutadiene having an amount of the 1,2-vinyl bond of 80% or more.

The amount of the 1,2-vinyl bond can be determined from the peak ratio of the proton NMR (nuclear magnetic resonance) of liquid polybutadiene.

The content of the liquid diene in the photosensitive resin composition layer (B) is preferably 10 to 40% by mass, more preferably 15 to 40% by mass, and still more preferably 20 to 40% by mass when the whole amount of the photosensitive resin composition is assumed to be 100% by mass from the viewpoint of the mechanical strength of the photosensitive resin structure for a printing plate according to the present embodiment, and the mechanical strength of a photosensitive resin plate for a printing plate, and a printing plate each using the same.

<Auxiliary Additive Component>

The auxiliary additive component is not particularly limited, and examples thereof include a polar group-containing polymer, a plasticizer other than a liquid diene, a thermal polymerization inhibitor other than a stabilizer, an antioxidant, an ultraviolet ray absorber, and a dye/pigment.

Examples of the polar group-containing polymer include, but not limited to, a water-soluble or water-dispersible copolymer having a polar group such as a hydrophilic group, such as a carboxyl group, an amino group, a hydroxy group, a phosphate group, or a sulfate group, or a salt thereof. More specific examples thereof include carboxyl group-containing NBR, carboxyl group-containing SBR, a polymer of a carboxyl group-containing aliphatic conjugated diene, an emulsified polymer of an ethylenically unsaturated compound having a phosphate group or a carboxyl group, a sulfate group-containing polyurethane, and carboxyl group-containing butadiene latex.

From the viewpoint of obtaining a high resolution in a printing plate using the photosensitive resin structure for a printing plate according to the present embodiment, carboxyl group-containing butadiene latex is preferable as the polar group-containing polymer.

These polar group-containing polymers may be used singly, or two or more thereof may be combined.

Examples of the plasticizer other than the liquid dienes include, but not limited to, hydrocarbon oils such as naphthene oil and paraffin oil; conjugated diene rubbers mainly composed of a liquid diene, such as a liquid acrylonitrile-butadiene copolymer and a liquid styrene-butadiene copolymer; polystyrene having a number average molecular weight of 2000 or less, a sebacic acid ester, and a phthalic acid ester. These may have a hydroxyl group or a carboxyl group at an end thereof. In addition, a photopolymerizable, reactive group such as a (meth)acryloyl group may be added thereto.

These plasticizers may be used singly, or two or more thereof may be used together.

As the thermal polymerization inhibitor and the antioxidant, those usually used in the field of resin materials or rubber materials can be used.

Specific examples thereof include a phenol-based material.

Examples of the phenol-based material include, but not limited to, vitamin E, tetrakis-(methylene-3-(3',5'-di-t-butyl-4'-hydroxyphenyl)propionate)methane, 2,5-di-t-butylhydroquinone, 2,6-di-t-butyl-p-cresol, and 2-t-butyl-6-(3-t-butyl-2-hydroxy-5-methylbenzyl)-4-methylphenyl acrylate.

These inhibitors of thermal polymerization and antioxidants may be used singly or in combinations of two or more thereof.

Examples of the ultraviolet ray absorber include known benzophenone-based, salicylate-based, acrylonitrile-based, metal complex-based, or hindered amine-based compounds. The dye/pigment described below may also be used as the ultraviolet ray absorber.

Examples of the ultraviolet ray absorber include, but not limited to, 2-ethoxy-2'-ethyloxalic acid bisanilide, and 2,2'-dihydroxy-4-methoxybenzophenone.

The dye/pigment is effective as coloring means for improving visibility.

Examples of the dye include, but not limited to, a basic dye, an acid dye, and a direct dye, which are water-soluble, and a sulfur dye, an oil-soluble dye, and a disperse dye, which are non-water-soluble. Particularly, a dye having an anthraquinone-based, indigoid-based, or azo-based structure is preferable, and an azo-based oil-soluble dye, or the like is more preferably used.

Examples of the pigment include, but not limited to, a natural pigment, a synthetic inorganic pigment, and a synthetic organic pigments, and examples of the synthetic organic pigment include an azo-based, triphenylmethane-based, quinoline-based, anthraquinone-based, or phthalocyanine-based pigment.

The amount of the total components of the above-described auxiliary additive components to be added is preferably 0 to 10% by mass, more preferably 0 to 5% by mass, and still more preferably 0 to 3% by mass when the whole amount of the photosensitive resin composition is assumed to be 100% by mass.

<Method for Producing Photosensitive Resin Composition Layer (B)>

The photosensitive resin composition layer (B) can be produced by various methods.

For example, the starting material for the photosensitive resin composition is dissolved in a predetermined solvent, for example, a solvent such as chloroform, tetrachloroethylene, methyl ethyl ketone, or toluene, to be mixed, and the resulting mixture is cast into a mold to evaporate the solvent and is thereby directly made into a plate.

The starting material can also be molded into a plate having a desired thickness with an extruding machine, an injection molding machine, a press, or the like after being kneaded with a kneader or a roll mill without using a solvent.

(Non-Infrared Ray-Shielding Layer (C))

The photosensitive resin structure for a printing plate according to the present embodiment has a non-infrared ray-shielding layer (C) ablatable with an infrared ray.

The non-infrared ray-shielding layer (C) contains a polymer (C-2) having a carboxylate group and an ester bond group in a molecule thereof; and an infrared ray absorber (C-3).

<Polyamide Resin (C-1)>

The photosensitive resin structure for a printing plate according to the present embodiment has a non-infrared ray-shielding layer (C), and the non-infrared ray-shielding layer (C) preferably further contains a polyamide resin (C-1).

When the polyamide resin (C-1) is contained, the effects of the invention of the present application can thereby be improved more because the affinity of the carboxylate group and the ester bond group in the polymer (C-2) having the carboxylate group and the ester bond group in a molecule thereof with the polyamide resin (C-1) can be made high, the polyamide resin (C-1) can be retained around the infrared ray absorber (C-3), which will be described later, the aggregation of the infrared ray absorber (C-3) can be prevented, enabling uniform dispersion, and a high optical density is obtained.

A polyamide resin is a polymer having an acid amide bond (—CO—NH—) in the main chain (Dictionary of Chemistry Popular Edition, Morikita Publishing Co., Ltd., edited by Shoji Shida, 1981).

Examples of a polyamide-forming monomer include lactam having 4 to 40 carbon atoms, an amino carboxylic acid, an equimolar salt of a diamine and a dicarboxylic acid, and a water-soluble, polyamide-forming monomer.

Examples of the polyamide-forming monomer include lactams such as caprolactam, enanthic lactam, and capryl lactam; aminocarboxylic acids such as ω-aminocapronic acid, w-aminoenanthic acid, and ω-aminocaprylic acid; and equivalent salts such as a salt of hexamethylenediamine and adipic acid, a salt of hexamethylenediamine and azelaic acid, and a salt of dodecamethylenediamine and adipic acid.

Polyamide resins are sold on the market for a hot melt type adhesive application, and effective polyamide resins can be selected in the present invention. Examples thereof include Macro Melt series manufactured by Henkel Japan Ltd., and T&K TOKA CO., LTD. Tohmide series.

<Polymer (C-2) Having Carboxylate Group and Ester Bond Group in Molecule thereof>

The non-infrared ray-shielding layer (C) contains a polymer (C-2) having a carboxylate group and an ester bond group in a molecule thereof (hereinafter, sometimes simply described as polymer (C-2)).

When the polymer (C-2) has both the carboxylate group and the ester bond group therein, the affinity with a polyester which is suitable as a cover film and the ethylenically unsaturated compound contained in the photosensitive resin is thereby improved, and therefore both the adhesive force between the non-infrared ray-shielding layer and the photosensitive resin layer and the adhesive force between the non-infrared ray-shielding layer and the cover film can be made sufficient, so that the handling properties can be improved.

The polymer (C-2) contains a structure in which carbon bonded to the carboxylate group and carbon bonded to the ester bond group are adjacent to each other.

The carbon bonded to the carboxylate group and the carbon bonded to the ester bond group are close to each other in the molecule, the dispersion of the infrared ray absorber (C-3) and a non-infrared ray-shielding substance is made good, so that non-infrared rays can be shielded efficiently and the optical density can be improved.

Various mechanisms to exhibit the above-described effects are conceivable, but, for example, the following mechanism is inferred.

The non-infrared ray-shielding layer (C) can be made by preparing a coating liquid for the non-infrared ray-shielding layer (C), coating the photosensitive resin composition layer (B) with the coating liquid, and drying the applied coating liquid.

The infrared ray absorbers (C-3) aggregate easily and therefore are likely to be in a state in which the infrared ray absorbers aggregate at a stage of storing the coating liquid, and therefore when the non-infrared ray-shielding layer (C) is made using the coating liquid, there has been a tendency in the past that the infrared ray absorbers are not in a state of being dispersed uniformly. As a result, the optical density of the non-infrared ray-shielding layer (C) is lowered, so that there has been a tendency that adverse effects, such as unintended image formation in a later process of exposing a printing plate or nonuniform dot diameters on a printing plate after plate making, are brought about.

However, when the coating liquid for the non-infrared ray-shielding layer (C) contains the polymer (C-2) in which the carbon bonded to the carboxylate group and the carbon bonded to the ester bond group are in positions adjacent to each other, the aggregation of the infrared ray absorbers (C-3) can be suppressed due to the steric hindrance or the like of the polymer (C-2). In detail, the infrared ray absorbers are liable to aggregate by dimerization of the carboxylate groups, but when the carboxylate group and the ester bond group are adjacent to each other, the dimerization of the carboxylate groups can thereby be suppressed due to the steric hindrance. Thereby, the non-infrared ray-shielding layer (C) in which the infrared ray absorbers are dispersed uniformly can be obtained and the optical density of the non-infrared ray-shielding layer (C) is improved.

The dispersion state of the infrared ray absorbers in the coating liquid can be measured using a dynamic light scattering type particle size distribution measurement apparatus or the like, and it can be decided that the smaller the median diameter (D50) is, the better the dispersibility is.

The "polymer (C-2) having a carboxylate group and an ester bond group in a molecule thereof" contained in the non-infrared ray-shielding layer (C) has a proportion of an ester bond group such that carbon bonded to the ester bond group and carbon bonded to the carboxylate group are adjacent to each other in all the ester bond groups of 15% or more, preferably 30% or more, more preferably 50% or more, and still more preferably 80% or more.

In all the ester bond groups, the proportion of the ester bond group such that carbon bonded to the ester bond group and carbon bonded to the carboxylate group are adjacent to each other can be measured using 13C-NMR.

Specifically, the proportion can be measured using Biospin Advance 600 (manufactured by Bulker, trade name) as a measurement device, using deuterated chloroform as a solvent, setting the sample concentration to 10% by mass, setting the observation frequency to 150 MHz, using TMS as a standard of chemical shifts, and setting the number of times of scanning to 4000 and the measurement temperature to 25° C.

Having a carboxylate group indicates having a carboxylate group in a side chain of the polymer, and the carboxylate group can be obtained by subjecting a (meth)acrylate containing a carboxylic acid to copolymerization.

Examples of the (meth)acrylic acid containing a carboxylate group include, but not limited to, (meth)acrylic acid, 2-methacryloyloxyethyl succinate, 2-methacryloyloxyethyl hexahydrophthalate, 2-acryloyloxyethyl-succinate, and 2-acryloyloxyethyl hexahydrophthalate.

Having an ester bond group indicates having an ester bond in a side chain, and the ester bond group can be obtained by subjecting a (meth)acrylate having an ester bond to copolymerization.

This (meth)acrylate can be obtained by reacting (meth) acrylic acid and an alcohol, and the alcohol is preferably a saturated hydrocarbon alcohol.

The saturated hydrocarbon alcohol is preferably used as the alcohol from the viewpoint of adhesion to the photosensitive resin composition layer (B) because the ester bond group contained in the polymer (C-2) thereby has a saturated hydrocarbon chain. In addition, from the viewpoint of improving the adhesiveness to the photosensitive resin composition layer (B) more, the saturated hydrocarbon chain preferably has 2 to 8 carbon atoms, and more preferably 4 to 8 carbon atoms in order to adjust the polarity of the polymer (C-2).

Examples of the (meth)acrylate having an ester bond group include, but not limited to, methyl (meth)acrylate, ethyl (meth)acrylate, n-butyl (meth)acrylate, isobutyl (meth) acrylate, tert-butyl (meth)acrylate, 2-ethylhexyl (meth)acrylate, n-lauryl (meth)acrylate, and n-stearyl (meth)acrylate.

The structure in which the carbon bonded to a carboxylate group and the carbon bonded to an ester group are adjacent to each other is obtained by copolymerizing a (meth)acrylate containing a carboxylate group and a (meth)acrylate having an ester bond group.

Generally, a (Head to Tail) reaction through which a structure in which the carbon bonded to a carboxylate group and the carbon bonded to an ester bond group are not adjacent to each other is produced occurs preferentially, but the proportion of a polymer containing the structure in which the carbon bonded to a carboxylate group and the carbon bonded to an ester bond group are adjacent to each other can be increased and can be controlled within the above-described numerical value range by increasing the amount of the polymerization initiator or controlling the reaction temperature so as to be high.

The polymer having an ester bond group and a carboxylate group is also obtained by making an ester through alcohol addition to maleic anhydride and polymerizing the esterified maleic anhydride.

Examples of such an alcohol-added maleic anhydride include a half-esterified maleic anhydride obtained by reacting maleic anhydride with an alkyl alcohol such as methanol, ethanol, propanol, butanol, pentanol, or hexanol.

The polymer (C-2) preferably further contains an aromatic hydrocarbon group. Thereby, the affinity between the non-infrared ray-shielding layer (C) and the photosensitive resin composition layer (B) is improved, so that the adhesiveness between the photosensitive resin composition layer (B) and the non-infrared ray-shielding layer (C) can be improved more.

Having an aromatic hydrocarbon group indicates having a group provided with an aromatic ring in a side chain of the polymer, and the aromatic hydrocarbon group can be obtained by polymerizing a monovinyl-substituted aromatic hydrocarbon, an aromatic ring-containing (meth)acrylate, or the like.

Particularly, a monovinyl-substituted aromatic hydrocarbon is preferably used from the viewpoint of the adhesiveness to the photosensitive resin composition layer (B).

Examples of the monovinyl-substituted aromatic hydrocarbon include, but not limited to, styrene, t-butylstyrene, divinylbenzene, 1,1-diphenylstyrene, N,N-dimethyl-p-aminoethylstyrene, N,N-diethyl-p-aminoethylstyrene, vinylpyridine, p-methylstyrene, p-methoxystyrene, tertiary-butylstyrene, α-methylstyrene, and 1,1-diphenylethylene.

From the viewpoint of the adhesiveness between the non-infrared ray-shielding layer (C) and the photosensitive resin composition layer (B), the aromatic ring contained in the side chain is preferably monofunctional, and from the viewpoint of enhancing the adhesion force to the photosensitive resin composition layer (B) more, styrene is more preferably used.

When the polymer (C-2) has a carboxylate group, an ester bond group, and an aromatic hydrocarbon group, methods for making the polymer (C-2) include a method of copolymerizing the monovinyl-substituted aromatic hydrocarbon and a (meth)acrylate having the carboxylate group and an ester bond, and also include a method of copolymerizing a monovinyl-substituted aromatic hydrocarbon and half-esterified maleic anhydride.

The copolymer of half-esterified maleic anhydride is such that carbon bonded to a carboxylate group and carbon bonded to an ester bond are adjacent to each other, and the copolymer is more preferably used as a (C-2) component from the viewpoint of the adhesiveness between the non-infrared ray-shielding layer (C) and the photosensitive resin composition layer (B) and the affinity with the above-described polyamide resin (C-1), and is preferably used also from the viewpoint of productivity because the amount of the starting substances to be reacted can be reduced.

Styrene maleic anhydride esterified resins are sold on the market and can be used in the present invention. Examples of such resins include KAWAHARA PETROCHEMICAL CO., LTD. SMA Resin series and ARAKAWA CHEMICAL INDUSTRIES, LTD. ARASTAR series.

From the viewpoint of the mechanical strength of the non-infrared ray-shielding layer (C), the molar ratio of the aromatic hydrocarbon group, the carboxylate group, and the ester bond group is preferably aromatic hydrocarbon group: carboxylate group:ester bond group=20 to 1:10 to 0.1:1, more preferably 15 to 1:5 to 0.1:1, and still more preferably 15 to 1:5 to 0.5:1.

The polymer (C-2) preferably has a number average molecular weight of 500 or more, more preferably 1000 or more, and still more preferably 2000 or more from the viewpoint of the mechanical strength of the non-infrared ray-shielding layer (C).

The number average molecular weight of the polymer (C-2) can be measured by gel permeation chromatography (GPC) and is expressed by a molecular weight in terms of polystyrene.

The mass ratio of the polyamide resin (C-1) and the polymer (C-2) which are contained in the non-infrared ray-shielding layer (C) is preferably 1:0.0001 to 3, more preferably 1:0.0001 to 1, still more preferably 1:0.001 to 1, and further still more preferably 1:0.01 to 1 in terms of (C-1):(C-2) from the viewpoint of the film strength of the non-infrared ray-shielding layer (C).

<Infrared Ray Absorber (C-3)>

The non-infrared ray-shielding layer (C) contains an infrared ray absorber (C-3).

As the infrared ray absorber, a simple substance or a compound having strong absorption in a range of 750 to 2000 nm is usually used.

Examples of the infrared ray absorber include, but not limited to, inorganic pigments such as carbon black, graphite, copper chromite, and chromium oxide, and coloring matter such as polyphthalocyanine compounds, cyanine coloring matter, and metal thiolate coloring matter.

Carbon black in particular can be used in a wide range of a particle diameter of 13 to 85 nm, and the smaller the particle diameter is, the higher the sensitivity to infrared laser is.

These infrared ray absorbers are added in a range where the sensitivity for enabling ablation by a laser beam to be used is imparted. Generally, the addition in an amount of 10 to 80% by mass in the non-infrared ray-shielding layer (C) is effective, more preferably 20 to 40% by mass, and still more preferably 25 to 35% by mass.

Particularly, when the non-infrared ray-shielding layer (C) contains the polyamide resin (C-1), the mass ratio of the polyamide resin (C-1) to the infrared ray absorber (C-3) is preferably (C-1):(C-3)=1:0.15 to 2, more preferably 1:0.3 to 2, and still more preferably 1:0.5 to 2.

The mass of the polyamide resin (C-1), the mass of the polymer (C-2) having a carboxylate group and an ester bond group in a molecule thereof, and the mass of the infrared ray absorber (C-3) can be measured by peeling the non-infrared ray-shielding layer (C) from a printing plate before curing, and thereafter dissolving the non-infrared ray-shielding layer (C) in a solvent such as tetrahydrofuran to separate the infrared ray absorber (C-3) by filtration; and then separating the polyamide resin (C-1) and the polymer (C-2) having a carboxylate group and an ester bond group in a molecule thereof by column chromatography.

<Non-Infrared Ray-Shielding Substance>

The non-infrared ray-shielding layer (C) preferably contains a non-infrared ray-shielding substance.

Examples of the non-infrared ray-shielding substance include a substance that reflects or absorbs ultraviolet light.

An ultraviolet ray absorber, carbon black, graphite, and the like are good examples of the non-infrared ray-shielding substance, and the amount to be added is set so that necessary optical density can be achieved. Generally, the non-infrared ray-shielding substance is preferably added so that the optical density will be 2.5 or more, and preferably 3.0 or more. The non-infrared ray-shielding substance may be the same as or different from the infrared ray absorber (C-3).

<Method for Making Non-Infrared Ray-Shielding Layer (C)>

The non-infrared ray-shielding layer (C) is obtained by forming a resin composition, which is obtained by dissolving the components described above in an appropriate solvent, into a film.

A solution of the resin composition is prepared by dissolving the components for this non-infrared ray-shielding layer (C); a predetermined amount of the resin composition is fed uniformly on a film such as, for example, a polyethylene terephthalate film or a polypropylene film using a bar coater, a gravure coater, or the like; the applied resin composition is then dried; and the non-infrared ray-shielding layer (C) can thereby be made.

The film thickness of the non-infrared ray-shielding layer (C) is preferably 0.1 to 50 µm, more preferably 0.1 to 20 µm, and still more preferably 0.1 to 10 µm from the viewpoint of the laser ablation sensitivity of the non-infrared ray-shielding layer (C).

The solution of the resin composition used when the non-infrared ray-shielding layer (C) is formed is preferably a coating liquid containing an infrared ray absorber (C-3) having a median diameter of 0.2 to 0.3 µm.

The infrared ray absorber (C-3) in the coating liquid preferably has a median diameter of 0.2 µm or more, more preferably 0.22 µm or more, and still more preferably 0.24 µm or more from the viewpoint of stability at the time of coating.

The infrared ray absorber (C-3) in the coating liquid preferably has a median diameter of 0.3 µm or less, more preferably 0.29 µm or less, and still more preferably 0.28 µm or less in order to obtain a high optical density.

In the photosensitive resin structure for a printing plate according to the present embodiment, the proportion of the area of the infrared ray absorber (C-3) in a section of the non-infrared ray-shielding layer (C) is preferably 50% or more from the viewpoint of a high optical density. The proportion of the area is more preferably 55% or more, and still more preferably 60% or more.

The proportion of the area of the infrared ray absorber (C-3) in the section of the non-infrared ray-shielding layer (C) can be controlled in the above-described numerical value range by changing the coating method, the drying temperature, and the like in forming the film of the non-infrared ray-shielding layer.

[Method for Producing Photosensitive Resin Structure for Printing Plate]

The photosensitive resin structure for a printing plate according to the present embodiment can be made by, for example, the following method.

The photosensitive resin structure for a printing plate can be obtained by: providing the photosensitive resin composition layer (B) on the support (A) by applying the photosensitive resin composition components that constitute the photosensitive resin composition layer (B) or using an extrusion machine, injection molding, or press molding; and laminating the photosensitive resin composition (B) obtained in this way and the non-infrared ray-shielding layer (C), which has been formed on a film, so as to be in contact with each other.

[Some Other Constitution of Photosensitive Resin Structure for Printing Plate](Particle Layer (D))

The photosensitive resin structure for a printing plate according to the present embodiment may be configured to have a particle layer (D) between the non-infrared ray-shielding layer (C) and the photosensitive resin composition layer (B).

By providing the particle layer (D), the printing performance can be improved, and, for example, ink densities can be improved.

This particle layer (D) can be formed with a resin composition containing a particle having a pore structure.

The particle having a pore structure preferably has a specific surface area of 350 $m^2/g$ or more and 1000 $m^2/g$ or less. When fine pores exist in such a pore structure, the specific surface area relative to the mass is thereby made large.

From the viewpoint of sufficiently filling the pores of the particle having a pore structure with a binder having a crosslinkable group, the specific surface area is preferably 350 $m^2/g$ or more and 1000 $m^2/g$ or less, more preferably 400 $m^2/g$ or more and 900 $m^2/g$ or less, and still more preferably 450 $m^2/g$ or more and 800 $m^2/g$ or less.

This specific surface area can be measured by a gas adsorption method, for example, by JIS-Z-8830.

Examples of such a particle include, but not limited to, inorganic oxides such as silica, alumina, and ceria; carbon particles such as carbon black; and polymer particles composed of polymethyl methacrylate, a polyurethane, or the like. Inorganic oxides in particular are preferable because of having an excellent chemical stability and having a high specific surface area. Among the inorganic oxides, silica is more preferably used because of having a high specific surface area. Further, a surface treatment may be performed on these particles within a range where the pore structure is not lost.

(Intermediate Layer (E))

Further, the photosensitive resin structure for a printing plate according to the present embodiment may have an intermediate layer (E) between the non-infrared ray-shielding layer (C) and the photosensitive resin composition layer (B).

The intermediate layer (E) preferably has a sufficient softness so as not to impair the flexibility of a printing plate, and examples of the material used suitably for the intermediate layer (E) include, but not limited to, an ethylene-vinyl alcohol copolymer, polyvinyl alcohol, polyvinyl acetate, polyvinyl butyral, polyvinylpyrrolidone, polyvinyl chloride, polyvinylidene chloride, polyvinyl fluoride, polyvinylidene fluoride, polyacrylonitrile, polymethyl methacrylate, polyacetal, polycarbonate, polystyrene, polycarbonate, polyethylene, polypropylene, a cellulose derivative, a polyester, a polyamide, a polyimide, a polyurethane, silicon rubber, butyl rubber, and isoprene rubber. These polymers may be used singly or in combinations of two or more thereof.

The intermediate layer (E) preferably contains a polyamide resin from the viewpoint of handling properties of the photosensitive resin structure for a printing plate, and the polyamide resin is preferably a dimer acid-based thermoplastic polyamide or a water-soluble polyamide from the viewpoint of solubility to a washing liquid.

The "water-soluble polyamide" means a polyamide exhibiting solubility to water, and specifically means to have a solubility to water at 25° C. of 3% by mass or more.

The water-soluble polyamide includes those having various structures. Examples thereof include, but not limited to, 6-nylon, 12-nylon, 11-nylon, 66-nylon, 610-nylon, and copolymerized products of these types of nylon.

The water-'soluble polyamide is preferably such that part of the skeleton is substituted with a hydrophilic group from the viewpoint of the strength at high temperatures. Examples of the hydrophilic group include, but not limited to, a hydroxy group, an alkoxy group, an ethylene oxide group, polyether groups such as a propylene oxide group, a carbonyl group, a carboxy group, an amino group, a urea group, a cyano group, a sulfate group, and a phosphate group.

A water-soluble polyamide having a dimethyl amino group or an alkoxymethyl group among the hydrophilic groups is particularly preferable from the viewpoint of the strength at high temperatures.

The substitution ratio with a hydrophilic group in the water-soluble polyamide is not particularly limited as long as the polyamide exhibits a sufficient solubility to water, but is preferably 10% or more, more preferably 15% or more, and still more preferably 20% or more.

The solubility is changed depending on the degree of modification, the polymerization ratio, and the like, but these water-soluble polyamides have a solubility to water at 25° C. of 3% by mass or more, and those having the solubility of 10% by mass or more are preferable.

As such a water-soluble polyamide, water-soluble nylon which is substituted with a dimethyl amino group: AQ-nylon, A-90, and P-70 (manufactured by Toray Industries, Inc.), FINELEX FR-700E (manufactured by Namariichi, Co., Ltd.), which is substituted with a methoxy methyl group, and the like are sold on the market.

These polyamides may be used singly or in combinations of two or more thereof.

The content by percentage of the water-soluble polyamide in the intermediate layer (E) is preferably 30% by mass or more, more preferably 40% by mass or more, and still more preferably 50% by mass or more based on the whole amount of the intermediate layer from the viewpoint of the strength at high temperatures.

Besides the water-soluble polyamide, an additional polymer may be used together in the intermediate layer (E) within a range where the performance is not impaired.

Examples of the additional polymer include, but not limited to, an ethylene-vinyl alcohol copolymer, polyvinyl alcohol, polyvinyl acetate, polyvinyl butyral, polyvinylpyrrolidone, polyvinyl chloride, polyvinylidene chloride, polyvinyl fluoride, polyvinylidene fluoride, polyacrylonitrile, polymethyl methacrylate, polyacetal, polycarbonate, polystyrene, polycarbonate, polyethylene, polypropylene, a cellulose derivative, a polyester, a polyimide, a polyurethane, silicon rubber, butyl rubber, and isoprene rubber.

From the viewpoint of compatibility with the water-soluble polyamide, the polymer to be used together is also preferably water-soluble.

These polymers may be used singly or in combinations of two or more thereof.

The intermediate layer (E) preferably contains a polyurethane in order to make the adhesiveness between the intermediate layer (E) and the photosensitive resin composition layer (B) and between the intermediate layer (E) and the ultraviolet ray-shielding layer (D) good.

The polyurethane is not particularly limited as long as it is a polymer having a urethane bond, and examples thereof include a polyurethane obtained by reacting a polyol compound and a polyisocyanate.

A hydrophilic group-containing compound is also preferably added as a polymerization component in addition to the polyol compound and the polyisocyanate in order to dissolve or disperse the polyurethane stably in an organic solvent and/or water.

Examples of the polyol compound include, but not limited to, a polyether polyol, a polyester polyol, and a polyacrylic polyol. Among these, a polyether polyol is preferable.

Examples of the polyether polyol include a polyether polyol obtained by subjecting an ionically polymerizable cyclic compound to ring-opening copolymerization with a polyhydric alcohol, namely a reaction product of a polyhydric alcohol and an ionically polymerizable cyclic compound.

Examples of the polyhydric alcohol include, but not limited to, ethylene glycol, polyethylene glycol, propylene glycol, polypropylene glycol, polytetramethylene glycol, polyhexamethylene glycol, polyheptamethylene glycol, polydecamethylene glycol, glycerin, trimethylolpropane, pentaerythritol, bisphenol A, bisphenol F, hydrogenated bisphenol A, hydrogenated bisphenol F, hydroquinone, naphthohydroquinone, anthrahydroquinone, 1,4-cyclohexanediol, tricyclodecanediol, tricyclodecanedimethanol, pentacyclopentadecanediol, and pentacyclopentadecanedimethanol. These may be used singly or in combinations of two or more thereof.

Examples of the ionically polymerizable cyclic compound include, but not limited to, cyclic ethers such as ethylene oxide, propylene oxide, 1,2-butylene oxide, butene-1-oxide, isobutene oxide, 3,3-bischloromethyloxetane, tetrahydrofuran, 2-methyltetrahydrofuran, 3-methyltetrahydrofuran, dioxane, trioxane, tetraoxane, cyclohexene oxide, styrene oxide, epichlorohydrin, glycidyl methacrylate, allyl glycidyl ether, allyl glycidyl carbonate, butadiene monoxide, isoprene monoxide, vinyloxetane, vinyltetrahydrofuran, vinylcyclohexene oxide, phenyl glycidyl ether, butyl glycidyl ether, and glycidyl benzoate. These may be used singly or in combinations of two or more thereof.

As the polyol compound, a polyether polyol obtained by subjecting the ionically polymerizable cyclic compound, and a cyclic imine such as ethylene imine, a cyclic lactonic acid such as P-propiolactone or glycolic acid lactide, or a dimethylcyclopolysiloxane to ring-opening copolymerization can also be used. Each of these ring-opening copolymers of the ionically polymerizable cyclic compound may have random bonds or may have bonds forming a block.

As the polyisocyanate, a polyisocyanate generally used for producing a polyurethane can be used without particular limitations.

Examples of the polyisocyanate include, but not limited to, 2,4-tolylene diisocyanate, 2,6-tolylene diisocyanate, 1,3-xylylene diisocyanate, 1,4-xylylene diisocyanate, 1,5-naphthalene diisocyanate, m-phenylene diisocyanate, p-phenylene diisocyanate, 3,3'-dimethyl-4,4'-diphenylmethane diisocyanate, 4,4'-diphenylmethane diisocyanate, 3,3'-dimethylphenylene diisocyanate, 4,4'-biphenylene diisocyanate, 1,6-hexane diisocyanate, isophorone diisocyanate, methylene bis(4-cyclohexyl isocyanate), 2,2,4-trimethylhexamethylene diisocyanate, bis(2-isocyanatoethyl) fumarate, 6-isopropyl-1,3-phenyl diisocyanate, 4-diphenylpropane diisocyanate, lysine diisocyanate, hydrogenated diphenylmethane diisocyanate, hydrogenated xylylene diisocyanate, tetramethylxylylene diisocyanate, and 2,5 (or 6)-bis(isocyanatomethyl)-bicyclo[2.2.1]heptane.

These polyisocyanates may be used singly or in combinations of two or more thereof.

The polyurethane used in the present embodiment preferably has a number average molecular weight of 1,000 to 200,000, and more preferably 30,000 to 100,000 from the viewpoint of softness.

The polyurethane resin used in the present embodiment is preferably a polyether polyurethane obtained by reacting a polyether polyol and an isocyanate in order to make the adhesiveness between the intermediate layer (E) and the photosensitive resin composition layer (B) and between the intermediate layer (E) and the ultraviolet ray-shielding layer (D) sufficiently strong. As such a polyurethane, Yuriano W321 (manufactured by ARAKAWA CHEMICAL INDUSTRIES, LTD.), HYDRAN WLS202 (manufactured by DIC Corporation), and the like are sold on the market.

The content by percentage of the polyurethane in the intermediate layer (E) is preferably 0.5% by mass or more, more preferably 5% by mass or more, and still more preferably 10% by mass or more based on the whole amount of the intermediate layer from the viewpoint of the adhesiveness.

Further, the content by percentage is preferably 70% by mass or less, more preferably 50% by mass or less, and still more preferably 30% by mass or less.

When the content by percentage of the polyurethane is 0.5% by mass or more, a sufficient adhesiveness is thereby obtained, and when the content by percentage is 70% by mass or less, a sufficient strength is thereby obtained.

An additional component such as, for example, a surfactant, an antiblocking agent, a release agent, a UV absorber, a dye, or a pigment may be added in the intermediate layer (E) in a range where the strength and the softness are not impaired.

The intermediate layer (E) preferably has a thickness of 0.5 µm or more and 20 µm or less. When the thickness is 0.5 µm or more, a sufficient film strength is thereby obtained, and when the thickness is 20 µm or less, deterioration of image-forming properties due to scattering of light during relief exposure can thereby be suppressed sufficiently. The thickness is more preferably 0.5 µm or more and 10 µm or less, and still more preferably 0.5 µm or more and 5 µm or less.

The photosensitive resin composition layer (B) is exposed to an ultraviolet ray through the intermediate layer (E) during the relief exposure, and therefore the intermediate layer (E) needs to be formed with a material that transmits ultraviolet rays.

The intermediate layer (E) preferably has an ultraviolet ray transmittance at a wavelength of 365 nm of 40% or more. When the ultraviolet ray transmittance is 40% or more, curing the photosensitive resin composition layer is performed sufficiently, so that sufficient image formation can be obtained. The ultraviolet ray transmittance is more preferably 50% or more, and still more preferably 60% or more.

[Photosensitive Resin Plate for Printing Plate, and Printing Plate]

A photosensitive resin plate for a printing plate, and a printing plate can be produced using the photosensitive resin structure for a printing plate according to the present embodiment.

One example of the plate making method is described below.

First, exposure is performed through the support (A) to photo-cure the photosensitive resin composition layer, thereby providing a thin, uniform cured layer (back exposure).

When a film is laminated on the non-infrared ray-shielding layer (C) of the photosensitive resin structure for a printing plate, the film is first peeled.

Thereafter, the non-infrared ray-shielding layer (C) is irradiated to be patterned with an infrared ray, thereby forming a mask on the photosensitive resin composition layer.

Suitable examples of the infrared laser include ND/YAG laser (for example, 1064 nm) or diode laser (for example, 830 nm).

In this infrared laser ablation technique, appropriate laser systems are sold on the market, and, for example, a diode laser system CDI Spark (ESKO GRAPHICS bvba.) can be used.

This laser system includes: a rotary cylindrical drum that holds a printing original plate; an IR laser irradiation apparatus; and a layout computer, and image information is directly sent from the layout computer to the laser apparatus.

After a pattern is drawn on the non-infrared ray-shielding layer (C), the whole surface of the photosensitive resin composition layer (B) is irradiated with an ultraviolet ray.

The same irradiation unit as the one used in the ultraviolet ray irradiation from the side of the support (A) can be used as this irradiation unit.

Examples of the light source used for photo-curing the photosensitive resin composition layer include, but not limited to, a high-pressure mercury lamp, an ultraviolet fluorescent lamp, a carbon arc lamp, a xenon lamp, and sunlight.

A developing treatment of washing away unexposed portions is performed after this whole surface exposure.

Examples of the developing solvent include, but not limited to, chlorine-based organic solvents such as 1,1,1-trichloroethane and tetrachloroethylene; esters such as heptyl acetate and 3-methoxybutyl acetate; hydrocarbons such as petroleum fractions, toluene, and decaline; and mixtures obtained by mixing an alcohol such as propanol, butanol, or pentanol therewith.

As the developing solution, an aqueous developing liquid can also be used, and examples thereof include a mixed liquid of water and an alcohol; and a surfactant.

Examples of the aqueous washing liquid include, but not limited to, a washing liquid containing one or two or more nonionic, anionic, cationic, or amphoteric surfactants.

Examples of the anionic surfactant include a linear alkylbenzene sulfonate having an alkyl having 8 to 16 carbon atoms on average, an α-olefin sulfonate having 10 to 20 carbon atoms on average, a dialkyl sulfosuccinate containing an alkyl group or an alkenyl group having 4 to 10 carbon atoms, a sulfonate of an aliphatic acid lower alkyl ester, an alkyl sulfate having 10 to 20 carbon atoms on average, an alkyl ether sulfate with 0.5 to 8 mol on average of ethylene oxide added thereto, the alkyl ether sulfate having a linear or branched-chain alkyl group or alkenyl group having 10 to 20 carbon atoms on average, and a saturated or unsaturated aliphatic acid salt having 10 to 22 carbon atoms on average.

Examples of the cationic surfactant include an alkyl amine salt, an ethylene oxide adduct of an alkylamine, an alkyltrimethylammonium salt, an alkyl dimethyl benzyl ammonium salt, a Sapamine type quaternary ammonium salt, or a pyridinium salt.

Examples of the nonionic surfactant include a polyethylene glycol type alkylene oxide adduct of a higher alcohol, an alkylene oxide adduct of an alkylphenol, an alkylene oxide adduct of an aliphatic acid, an alkylene oxide adduct of a polyhydric alcohol aliphatic acid ester, an alkylene oxide adduct of a higher alkylamine, an alkylene oxide adduct of an aliphatic acid amide, alkylene oxide adducts of oils and fats, an alkylene oxide adduct of polypropylene glycol, a polyhydric alcohol type aliphatic acid ester of glycerol, an aliphatic acid ester of pentaerythritol, an aliphatic acid ester of sorbitol and of sorbitan, an aliphatic acid ester of sucrose, an alkyl ether of a polyhydric alcohol, and an aliphatic acid amide of an alkanolamine.

Examples of the amphoteric surfactant include sodium laurylaminopropionate and lauryl dimethyl betaine.

The concentration of the surfactant in the developing solution is not particularly limited, but usually, the concentration is preferably in a range of 0.5 to 10% by mass based on the whole amount of the washing liquid.

If necessary, a washing auxiliary agent such as a washing accelerating agent or a pH modifier may be blended in the aqueous washing liquid in addition to the above-described surfactant.

Washing away the unexposed portions may be performed by a jet from a nozzle or may be performed by brushing with a brush.

Post-exposure is performed following rinse washing and drying processes after the developing treatment, thereby obtaining a photosensitive resin plate for a printing plate, and a predetermined treatment is performed on the photosensitive resin plate to obtain a printing plate.

EXAMPLES

Hereinafter, the present invention will be described giving specific Examples and Comparative Examples, but the present invention is not limited to these.

Examples 1 to 11, Comparative Examples 1 to 5

A photosensitive resin composition was prepared and a photosensitive resin structure for a printing plate was produced in the manner as described below.

First, in accordance with the material composition shown in Table 1 below, those materials were kneaded with a kneader (Powrex Corporation, FM-MW-3) at 140° C. for 60 minutes to prepare a photosensitive resin composition.

All the ratios shown in Table 1 below represent parts by mass.

The components in Table 1 are as follows.

Polymer A: Thermoplastic elastomer "D-KX405" (Kraton Polymers Japan Ltd., trade name), which is a styrene-butadiene block copolymer Liquid polybutadiene A: Liquid polybutadiene having a number average molecular weight of 6000, weight average molecular weight/number average molecular weight=1.15, an amount of the 1,2-vinyl bond of 55%, and a viscosity at 38° C. of 5.3 Pa·s.

Liquid polybutadiene B: Liquid polybutadiene having a number average molecular weight of 3200, weight average molecular weight/number average molecular weight=1.29, an amount of the 1,2-vinyl bond of 90%, and a viscosity at 45° C. of 25.0 Pa·s.

Liquid polybutadiene C: Liquid polybutadiene having a number average molecular weight of 4600, weight average molecular weight/number average molecular weight=3.79, an amount of the 1,2-vinyl bond of 1%, and a viscosity at 40° C. of 0.70 Pa·s.

1,9-Nonanediol diacrylate 2,2-Dimethoxy-phenylacetophenone

2-Methyl-1-[4-(methylthio)phenyl]-2-(4-morpholinyl)-1-propanone

Phenol-based stabilizer: 2,6-di-t-butyl-p-cresol

TABLE 1

|  | Parts by mass |
| --- | --- |
| Polymer A | 59 |
| Liquid polybutadiene A | 7.5 |
| Liquid polybutadiene B | 11.3 |
| Liquid polybutadiene C | 11.2 |
| 1,9-Nonanediol diacrylate | 7 |
| 2,2-Dimethoxy-phenylacetophenone | 2 |
| 2-Methyl-1-[4-(methylthio)phenyl]-2-(4-morpholinyl)-1-propanone | 1 |
| 2,6-Di-t-butyl-p-cresol | 1 |

Next, a polyethylene terephthalate film (support) having an undercoat layer was produced in the manner as described below.

In an air atmosphere, 93 g of ethylene glycol, 374 g of neopentyl glycol, and 382 g of phthalic acid were subjected to condensation reaction at a reaction temperature of 180° C. and a reduced pressure of $1.33 \times 10^3$ Pa for 6 hours, thereafter 125 g of 4,4-diphenylene diisocyanate was added thereto, and further, a reaction mixture was reacted at 80° C. for 5 hours to obtain a resin.

The resin was made into a 10% aqueous solution, the aqueous solution was applied to a melt-extruded polyethylene terephthalate film, and the film was biaxially stretched after the application, thereby obtaining the polyethylene terephthalate film having an undercoat layer.

The obtained polyethylene terephthalate film (corresponding to support) having an undercoat layer had a thickness of 100 μm, and the undercoat layer had a thickness of 0.05 μm.

Next, a non-infrared ray-shielding layer was produced in accordance with the material composition shown in Table 2 and Table 3 below.

The components in Table 2 and Table 3 are as follows.
((C-1) Polyamide Resin)

Polyamide resin A: "TECHNOMELT 6900" (Henkel Japan, Ltd., trade name), which is a thermoplastic polyamide resin Polyamide resin B: "TECHNOMELT 6212" (Henkel Japan, Ltd., trade name), which is a thermoplastic polyamide resin Copolymer A: After a stainless steel reactor equipped with a jacket and a stirrer was purged sufficiently with nitrogen, 6,500 g of cyclohexane, 1.2 g of tetrahydrofuran, 220 g of styrene, 151 g of acrylic acid, and 302 g of isoamyl acrylate were loaded, and the temperature of the contents was set to 55° C. by passing warm water through the jacket.

Thereafter, an n-butyl lithium cyclohexane solution (pure content of 1.25 g) was added to start copolymerization.

A solution of the resulting copolymer was taken out, 10 g of water was added, and after the resulting mixture was stirred, the solvent was removed by steam stripping to obtain a water-containing polymer.

Subsequently, dehydration drying was performed with a heated roll to obtain a copolymer A.

The number average molecular weight as measured by GPC was found to be 8000.

Copolymer B: Styrene-maleic anhydride ester resin having an acid value of 62 and a number average molecular weight of 5500

Copolymer C: Styrene-maleic anhydride ester resin having an acid value of 105 and a number average molecular weight of 9500

Copolymer D: After a stainless steel reactor equipped with a jacket and a stirrer was purged sufficiently with nitrogen, 6,500 g of cyclohexane, 1.2 g of tetrahydrofuran, 220 g of styrene, and 302 g of acrylic acid were loaded, and the temperature of the contents was set to 55° C. by passing warm water through the jacket.

Thereafter, an n-butyl lithium cyclohexane solution (pure content of 1.25 g) was added to start copolymerization.

A solution of the resulting copolymer was taken out, 10 g of water was added, and after the resulting mixture was stirred, the solvent was removed by steam stripping to obtain a water-containing polymer.

Subsequently, dehydration drying was performed with a heated roll to obtain a copolymer D.

The number average molecular weight as measured by GPC was found to be 7000.

Copolymer E: After a stainless steel reactor equipped with a jacket and a stirrer was purged sufficiently with nitrogen, 6,500 g of cyclohexane, 1.2 g of tetrahydrofuran, 220 g of styrene, and 302 g of maleic anhydride were loaded, and the temperature of the contents was set to 55° C. by passing warm water through the jacket.

Thereafter, an n-butyl lithium cyclohexane solution (pure content of 1.25 g) was added to start copolymerization.

A solution of the resulting copolymer was taken out, 10 g of water was added, and after the resulting mixture was stirred, the solvent was removed by steam stripping to obtain a water-containing polymer.

Subsequently, dehydration drying was performed with a heated roll to obtain a copolymer E.

The number average molecular weight as measured by GPC was found to be 8000.

Copolymer F: After a stainless steel reactor equipped with a jacket and a stirrer was purged sufficiently with nitrogen, 6,500 g of cyclohexane, 1.2 g of tetrahydrofuran, 220 g of styrene, 151 g of acrylic acid, and 302 g of isoamyl acrylate were loaded, and the temperature of the contents was set to 75° C. by passing warm water through the jacket.

Thereafter, an n-butyl lithium cyclohexane solution (pure content of 3.00 g) was added to start copolymerization.

A solution of the resulting copolymer was taken out, 10 g of water was added, and after the resulting mixture was stirred, the solvent was removed by steam stripping to obtain a water-containing polymer.

Subsequently, dehydration drying was performed with a heated roll to obtain a copolymer F.

The number average molecular weight as measured by GPC was found to be 6000.
((C-3) Infrared Ray Absorber)

Carbon black: Carbon black "MITSUBISHI Carbon Black #30" (Mitsubishi Chemical Corporation, trade name), which has a particle diameter of 30 nm Each composition expressed by parts by mass shown in Table 2 and Table 3 was prepared so that the whole amount thereof was 100 g, and each of the resulting compositions was dissolved separately in a mixed solvent containing 560 g of toluene and 140 g of n-butanol utilizing ultrasonic waves to make coating liquids for forming a non-infrared ray-shielding layer of Examples 1 to 11 and Comparative Examples 1 to 5.

This coating liquid was applied to a polyester film to be a cover sheet, the film having a thickness of 100 μm, using a knife coater so that the amount of the coating liquid applied was 2.5 g/m² after drying, and the applied coating liquid was dried at 80° C. for 1 minute to obtain a film provided with a non-infrared ray-shielding layer.

Next, a photosensitive resin structure for a printing plate was produced using the photosensitive resin composition, the polyester film having an undercoat layer, and the film having a non-infrared ray-shielding layer, which were each obtained in the manner as described above.

Hot compression molding was performed in such a way that the photosensitive resin composition layer was interposed between the polyester film having an undercoat layer and the film provided with a non-infrared ray-shielding layer so that: the side of the undercoat layer of the support faced the photosensitive resin composition prepared in the manner as described above, and the side of the non-infrared ray-shielding layer of the film provided with a non-infrared ray-shielding layer faced the photosensitive resin composition; and the whole thickness was 1.5 mm, thereby obtaining the photosensitive resin structure for a printing plate.

During hot press on that occasion, a pressure of $1.96 \times 10^7$ Pa was applied under a condition of 130° C.

The size of a sheet of each photosensitive resin structure for a printing plate was set to 10 cm×15 cm.

Example 12

The following particle layer was formed on the non-infrared ray-shielding layer made in [Example 1].

In toluene, 75 parts by mass of TR2787 (manufactured by JSR Corporation, trade name) as a binder, and 25 parts by mass of SYLYSIA 430 (manufactured by FUJI SILYSIA CHEMICAL LTD., average particle diameter of 4.1 μm, specific surface area of 350 g/m$^2$), which is a silica, as a particle having a pore structure were dissolved utilizing ultrasonic waves, thereby preparing a uniform coating liquid having a solid concentration of 25%.

The coating liquid was applied to the non-infrared ray-shielding layer of [Example 1] using a knife coater so that the thickness after drying was 50 μm, and the applied coating liquid was dried at 80° C. for 4 minutes to obtain a film provided with a particle layer on the non-infrared ray-shielding layer.

A photosensitive resin structure for a printing plate of Example 12 was made in the same manner as in [Examples 1 to 11] described above except that hot molding was performed using this film so that the particle layer was brought into contact with the photosensitive resin composition layer.

This photosensitive resin structure for a printing plate of Example 12 was evaluated in the same manner as in [Examples 1 to 11] to obtain the results shown in Table 2.

Examples 13 and 14

The following intermediate layer was formed on the non-infrared ray-shielding layer made in [Example 1].

Each composition expressed by parts by mass shown in Table 4 was prepared so that the whole amount thereof was 100 g, and each of the resulting compositions was dissolved separately in a mixed solvent containing 350 g of toluene and 350 g of n-butanol utilizing ultrasonic waves to make coating liquids for an intermediate layer of Examples 13 and 14.

As the polyamide resin C, the following was used.

Polyamide resin C: "TECHNOMELT 6812" (Henkel Japan, Ltd., trade name), which is a thermoplastic polyamide resin The coating liquid for an intermediate layer was applied to the non-infrared ray-shielding layer of [Example 1] using a knife coater so that the thickness after drying was 5 μm, and the applied coating liquid was dried at 90° C. for 2 minutes to obtain a film provided with an intermediate layer on the non-infrared ray-shielding layer.

Photosensitive resin structures for a printing plate of Examples 13 and 14 were each made in the same manner as in [Example 1] described above except that hot molding was performed using this film so that the intermediate layer was brought into contact with the photosensitive resin composition layer.

After printing plates associated with these photosensitive resin structures for a printing plate of Examples 13 and 14 were each obtained by the method described in (Making Photosensitive Resin Plate for Printing Plate, and Evaluation thereof), which will be described later, the obtained printing plates were evaluated by the method described in <Fine Dot-Forming Properties> below.

Examples 15 to 18

The following intermediate layer was formed on the non-infrared ray-shielding layer made in [Example 1].

Each composition expressed by parts by mass shown in Table 4 was prepared so that the whole amount thereof was 100 g, and each of the resulting compositions was dissolved separately in a mixed solvent containing 450 g of water and 450 g of ethanol utilizing ultrasonic waves to make coating liquids for an intermediate layer of Examples 15 to 18.

As the water-soluble polyamide resin and the water-soluble polyurethane, the following were used.

Water-soluble polyamide resin A: "AQ Nylon P-70" (Toray Industries, Inc., trade name), which is a water-soluble polyamide resin Water-soluble polyamide resin B: FINELEX FR-700E (manufactured by Namariichi, Co., Ltd., trade name), which is a water-soluble polyamide resin Water-soluble polyamide resin C: "AQ Nylon A-90" (Toray Industries, Inc., trade name), which is a water-soluble polyamide resin Water-soluble polyurethane resin A: "Yuriano W321" (ARAKAWA CHEMICAL INDUSTRIES, LTD., trade name), which is a water-soluble polyurethane resin The coating liquid for an intermediate layer was applied to the non-infrared ray-shielding layer of [Example 1] using a knife coater so that the thickness after drying was 3 and the applied coating liquid was dried at 90° C. for 2 minutes to obtain a film provided with an intermediate layer on the non-infrared ray-shielding layer.

Photosensitive resin structures for a printing plate of Examples 15 to 18 were each made in the same manner as in [Example 1] described above except that hot molding was performed using this film so that the intermediate layer was brought into contact with the photosensitive resin composition layer.

These photosensitive resin structures for a printing plate of Examples 15 to 18 were evaluated in the same manner as in [Examples 13 and 14], and the results are shown in Table 4.

[Production of Photosensitive Resin Plate for Printing Plate]

In the photosensitive resin structures for a printing plate of [Examples 1 to 18] and [Comparative Examples 1 to 5] described above, only the polyester film was stripped off so that the non-infrared ray-shielding layer was transferred to the photosensitive resin composition layer, and each photosensitive resin structure was then loaded separately on a drum on "CDI-Spark" (manufactured by Esko-Graphics bvba., trade name, 1064 nm YAG laser) with the non-infrared ray-shielding layer on the outside.

Laser drawing was performed on the non-infrared ray-shielding layer on the photosensitive resin structure for a printing plate setting the laser power to 20 W and the drum rotation speed to 600 rpm to ablate some parts of the non-infrared ray-shielding layer to perform laser drawing of a test pattern having 150 lines (value showing the number of halftone dots disposed per inch) and a highlight of 1% to 5% (value expressing area ratio of halftone dots used for expressing light and shade of printing).

First, back exposure of 100 mJ/cm$^2$ was performed on an "AFP-1216E" exposure machine (manufactured by Asahi Kasei Corp., trade name) using the underside ultraviolet ray lamp (UV Lamp TL80W/10R manufactured by PHILIPS, trade name) from the side of the polyethylene terephthalate film having an undercoat layer.

Subsequently, irradiation with an ultraviolet ray of 8000 mJ/cm$^2$ was performed from the side of the non-infrared ray-shielding layer using the upper side lamp (UV Lamp TL80W/10R manufactured by PHILIPS, trade name).

The exposure intensity was measured with a "UV-35-ARP filter" using a UV meter "UV-MO2" manufactured by ORC MANUFACTURING CO., LTD.

Next, the side on which the above-described back exposure was performed was fixed on the rotating drum of an "AFP-1500" developing machine (manufactured by Asahi Kasei Corp., trade name) by sticking a double-sided tape to perform development using 3-methoxybutyl acetate as a developing liquid at a liquid temperature of 25° C. for 5 minutes, and then drying was performed at 60° C. for 2 hours.

Thereafter, as a post-exposure treatment, exposure of 2000 mJ/cm$^2$ was performed using ALF-200UP (manufactured by Asahi Kasei Corp., trade name) and a germicidal lamp (manufactured by TOSHIBA CORPORATION, GL-30, trade name) having a center wavelength of 254 nm on the whole surface of the photosensitive resin structure for a printing plate after drying to obtain a photosensitive resin plate for a printing plate.

The post-exposure value by the germicidal lamp herein was calculated from the intensity of illumination measured using a UV-25 filter of the "UV-MO2."

[Evaluation Methods Used in Examples and Comparative Examples]

<Adhesive Force between Photosensitive Resin Composition Layer and Non-Infrared Ray-Shielding Layer>

The adhesive force between the photosensitive resin composition layer (B) and the non-infrared ray-shielding layer (C) was evaluated for the photosensitive resin structures for a printing plate which were made as described above by the following method.

First, a photosensitive resin structure for a printing plate was cut out from the photosensitive resin structure for a printing plate for evaluation of 10 cm×15 cm described above into a size of 2.54 cm×10 cm and was used as a sample, and the cover film of the photosensitive resin structure for sample printing was peeled.

Thereafter, two rows of adhesive tapes (CELLOTAPE (R) CT-15 manufactured by Nichiban Co., Ltd., width of 15 mm) were stuck to the non-infrared ray-shielding layer so as to overlap with each other in a width of about 5 mm. The adhesive tapes were such that they function as a support of the non-infrared ray-shielding layer in the peeling process described below.

After the adhesive tapes were peeled in a length of 5 cm in a direction of peeling the adhesive tapes together with the non-infrared ray-shielding layer from the photosensitive resin composition layer, the adhesive tapes with the non-infrared ray-shielding layer stuck thereto were peeled from the photosensitive resin composition layer in the direction of 180° using Autograph AGS-100G (manufactured by SHIMADZU CORPORATION) at a cross head speed of 50 mm/min to measure the adhesive force (g/inch) between the photosensitive resin composition layer and the non-infrared ray-shielding layer.

<Adhesive Force between Non-Infrared Ray-Shielding Layer and Cover Film>

The adhesive force between the non-infrared ray-shielding layer and the cover film was evaluated for the photosensitive resin structures for a printing plate which were made as described above.

A photosensitive resin structure for a printing plate was cut out from the photosensitive resin structure for a printing plate for evaluation of 10 cm×15 cm into a size of 2.54 cm×10 cm and was used as a sample, and the cover film of the photosensitive resin structure for sample printing was peeled in a direction of being peeled to conduct the measurement in the manner as described below.

In peeling the cover film, the cover film side was peeled in the direction of 180° using Autograph AGS-100G (manufactured by SHIMADZU CORPORATION) at a cross head speed of 50 mm/min to measure the adhesive force (g/inch) between the non-infrared ray-shielding layer and the cover film.

<Evaluation of Handling Properties of Non-Infrared Ray-Shielding Layer>

In the photosensitive resin structures for a printing plate which were made in the manner as described above, only the polyester film stripped off so that the non-infrared ray-shielding layer was transferred to the photosensitive resin composition layer, and each photosensitive resin structure was then loaded separately on a drum on "CDI-Spark" (manufactured by Esko-Graphics bvba., trade name, 1064 nm YAG laser) with the non-infrared ray-shielding layer on the outside.

A pencil the lead of which was sharpened by about 5 to 6 mm, the pencil having a hardness of 5H (manufactured by Mitsubishi Pencil Co., Ltd., Hi-uni 5H), was put on the non-infrared ray-shielding layer so that the angle between the pencil and the non-infrared ray-shielding layer was 45°, and the pencil was dragged about 1 cm in length.

The non-infrared ray-shielding layer after dragging the pencil was observed to perform evaluation by the criteria as follows.

A scratch was not left on the non-infrared ray-shielding layer: ○

A scratch was left on the non-infrared ray-shielding layer, but the photosensitive resin composition layer was not exposed: Δ

The non-infrared ray-shielding layer was broken, and the photosensitive resin composition layer was exposed: ×

<Evaluation of Optical Density of Non-Infrared Ray-Shielding Layer>

Optical density of the films each provided with a non-infrared ray-shielding layer, which were made as described above, was measured with an X-rite 361T Black and White Transmission Densitometer (manufactured by X-rite, Incorporated, trade name) using ISO Visual as a detector.

<Fine Dot-Forming Properties>

The halftone dot area ratio of the dots in the 150 lines/inch, 2% portion of the photosensitive resin plates for a printing plate which were made as described above was measured using Flex3 Pro manufactured by BETA INDUSTRIES, INC.

When the halftone dot area ratio was 1.0% or more, it was estimated that the dots are formed in a practically good state and the fine dot-formation properties were rated as excellent.

<Evaluation of Dispersibility in Coating Liquid for Forming Non-Infrared Ray-Shielding Layer>

After the coating liquids for forming a non-infrared ray-shielding layer which were made as described above were each put in a metal container separately, and the metal container was sealed up, the coating liquids were stored at 23° C. for 1 week.

The dispersion state of the infrared ray absorbers in the coating liquids after 1 week was observed using a dynamic light scattering type particle diameter distribution measurement apparatus UPA-150 (manufactured by MicrotracBEL Corp., trade name) to measure the median diameter of the infrared ray absorbers.

The following Tables 2 and 3 show constituent materials for the non-infrared ray-shielding layer, the mass ratio of the polyamide resin (C-1) to the polymer (C-2) having a carboxylate group and an ester bond group in a molecule thereof, the mass ratio of the polyamide resin (C-1) to the infrared ray absorber (C-3), the content of the infrared ray absorber (C-3) in the non-infrared ray-shielding layer, and the results of the evaluations described above.

TABLE 2

|  |  | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Non-infrared ray-shielding layer | Polyamide resin A (Parts by mass) | 62 | 64 |  |  | 66 | 66 | 66 | 60 | 33 | 20 | 70 | 62 |
|  | Polyamide resin B (Parts by mass) |  |  | 64 | 64 |  |  |  |  |  |  |  |  |
|  | Copolymer A (Parts by mass) |  |  |  |  |  |  |  |  |  |  |  |  |
|  | Copolymer B (Parts by mass) | 4 | 2 |  | 4 |  |  |  |  |  |  |  | 4 |
|  | Copolymer C (Parts by mass) |  |  | 4 |  | 0.007 | 0.07 | 0.7 | 6 | 33 | 46 | 4 |  |
|  | Copolymer D (Parts by mass) |  |  |  |  |  |  |  |  |  |  |  |  |
|  | Copolymer E (Parts by mass) |  |  |  |  |  |  |  |  |  |  |  |  |
|  | Copolymer F (Parts by mass) |  |  |  |  |  |  |  |  |  |  |  |  |
|  | Carbon black (Parts by mass) | 34 | 34 | 34 | 34 | 34 | 34 | 34 | 34 | 34 | 34 | 26 | 34 |
| Proportion of ester bond group such that carbon bonded to the ester bond group and carbon bonded to the carboxylate group are adjacent to each other in all the ester bond groups | | 100 | 100 | 100 | 100 | 100 | 100 | 100 | 100 | 100 | 100 | 100 | 100 |
| (C-1):(C-2) | | 0.0645 | 0.0313 | 0.0625 | 0.0625 | 0.000106 | 0.00106 | 0.0106 | 0.100 | 1.00 | 2.30 | 0.0571 | 0.0645 |
| (C-1):(C-3) | | 0.548 | 0.531 | 0.531 | 0.531 | 0.515 | 0.515 | 0.515 | 0.567 | 1.03 | 1.70 | 0.371 | 0.548 |
| Proportion of (C-3) (% by mass) | | 34.0 | 34.0 | 33.3 | 33.3 | 34.0 | 34.0 | 33.8 | 34.0 | 34.0 | 34.0 | 26.0 | 34.0 |
| Adhesive force between photosensitive resin composition layer and non-infrared ray-shielding layer [g/inch] | | 340 | 250 | 260 | 330 | 105 | 140 | 210 | 370 | 730 | 1050 | 250 | 250 |
| Adhesive force between non-infared ray-shielding layer and cover film [g/inch] | | 45 | 42 | 44 | 44 | 37 | 39 | 41 | 50 | 69 | 83 | 40 | 44 |
| Evaluation of handling properties of non-infrared ray-shielding layer | | ○ | ○ | ○ | ○ | ○ | ○ | ○ | ○ | ○ | ○ | ○ | ○ |
| Optical density | | 3.8 | 3.6 | 4.1 | 3.8 | 3.1 | 3.7 | 4.2 | 4.0 | 3.2 | 3.0 | 3.0 | 3.7 |
| Median diameter of infrared ray absorber [μm] | | 0.247 | 0.267 | 0.247 | 0.253 | 0.249 | 0.258 | 0.241 | 0.257 | 0.271 | 0.271 | 0.258 | 0.247 |

TABLE 3

|  |  | Comparative Example 1 | Comparative Example 2 | Comparative Example 3 | Comparative Example 4 | Comparative Example 5 |
|---|---|---|---|---|---|---|
| Non-infrared ray-shielding layer | Polyamide resin A (Parts by mass) | 66 | 64 | 62 | 62 | 62 |
| | Polyamide resin B (Parts by mass) | | | | | |
| | Copolymer A (Parts by mass) | | | | 4 | |
| | Copolymer B (Parts by mass) | | | | | |
| | Copolymer C (Parts by mass) | | | | | |
| | Copolymer D (Parts by mass) | | 4 | | | |
| | Copolymer E (Parts by mass) | | | 4 | | |
| | Copolymer F (Parts by mass) | | | | | 4 |
| | Carbon black (Parts by mass) | 34 | 34 | 34 | 34 | 34 |
| Proportion of ester bond group such that carbon bonded to the ester bond group and carbon bonded to the carboxylate group are adjacent to each other in all the ester bond groups | | — | 0 | 0 | 7 | 12 |
| (C-1):(C-2) | | 0 | 0 | 0 | 0 | 0 |
| (C-1):(C-3) | | 0.515 | 0.531 | 0.548 | 0.548 | 0.548 |
| Proportion of (C-3) (% by mass) | | 34.0 | 33.3 | 34.0 | 34.0 | 34.0 |
| Adhesive force between photosensitive resin composition layer and non-infrared ray-shielding layer [g/inch] | | 51 | 63 | 600 | 120 | 140 |
| Adhesive force between non-infrared ray-shielding layer and cover film [g/inch] | | 14 | 53 | 89 | 25 | 30 |
| Evaluation of handling properties of non-infrared ray-shielding layer | | ○ | Δ | ○ | Δ | Δ |
| Optical density | | 2.7 | 2.3 | 2.1 | 2.6 | 2.8 |
| Median diameter of infrared ray absorber [μm] | | 0.478 | x | x | 0.365 | 0.332 |

TABLE 4

|  |  | Example 13 | Example 14 | Example 15 | Example 16 | Example 17 | Example 18 | Comparative Example 1 | Comparative Example 2 |
|---|---|---|---|---|---|---|---|---|---|
| Intermediate layer | Polyamide resin A (Parts by mass) | 96 | | | | | | | |
| | Polyamide resin C (Parts by mass) | | 96 | | | | | | |
| | Copolymer B (Parts by mass) | 4 | 4 | | | | | | |
| | Water-soluble polyamide resin A (Parts by mass) | | | 90 | | | | | |
| | Water-soluble polyamide resin B (Parts by mass) | | | | 90 | | | | |
| | Water-soluble polyamide resin C (Parts by mass) | | | | | 90 | 95 | | |
| | Water-soluble polyurethane (Parts by mass) | | | 10 | 10 | 10 | 5 | | |
| Area ratio of 150/inch, 2% highlight portion [%] | | 1.2 | 1.2 | 1.3 | 1.4 | 1.7 | 1.8 | x | x |

In Examples 1 to 12, the optical density of the non-infrared ray-shielding layer could be made high, and the handling properties were also good because when the polyester film, which is a cover film, was peeled from the non-infrared ray-shielding layer, the non-infrared ray-shielding layer was not peeled simultaneously with the polyester film from the photosensitive resin structure for a printing plate.

On the other hand, in Comparative Examples 1 and 2, the adhesive force between the photosensitive resin composition layer and the non-infrared ray-shielding layer was weak, and therefore when the polyester film, which is a cover film, was peeled from the non-infrared ray-shielding layer, the non-infrared ray-shielding layer was peeled simultaneously from the photosensitive resin structure for a printing plate, so that handling was very difficult and the printing plate could not be formed surely because the non-infrared ray-shielding layer was peeled partially.

In Comparative Examples 3 to 5, the handling properties were good because when the polyester film, which is a cover film, was peeled from the non-infrared ray-shielding layer, the non-infrared ray-shielding layer was not peeled simultaneously with the polyester film from the photosensitive resin structure for a printing plate, but the optical density of the non-infrared ray-shielding layer was lowered.

In Comparative Examples 1, 4 and 5, the median diameter of the infrared ray absorber in the coating liquid for a non-infrared ray-shielding layer was large to make the dispersibility poor, and in Comparative Examples 2 and 3, the infrared ray absorber was deposited, and therefore the median diameter could not be measured.

In Examples 1 to 12, handling was easy because when the non-infrared ray-shielding layer was handled after the polyester film was removed to make the non-infrared ray-shielding layer the outermost surface, a scratch did not occur even if a nail hit the non-infrared ray-shielding layer.

In Examples 13 to 18, a very fine highlight could be formed, but in Comparative Examples 1 and 2, a highlight was not formed and practically sufficient highlight-forming properties were not obtained.

The present application is based on a Japanese Patent Application (Japanese Patent Application No. 2017-140762) filed with Japan Patent Office on Jul. 20, 2017, a Japanese Patent Application (Japanese Patent Application No. 2017-205954) filed with Japan Patent Office on Oct. 25, 2017, and a Japanese Patent Application (Japanese Patent Application No. 2018-018523) filed with Japan Patent Office on Feb. 5, 2018, the contents of which are incorporated herein by reference.

INDUSTRIAL APPLICABILITY

The photosensitive resin structure for a printing plate according to the present invention has industrial applicability as a material for producing a flexographic printing plate.

The invention claimed is:

1. A photosensitive resin structure for a printing plate, comprising:
    a support (A);
    a photosensitive resin composition layer (B) comprising a thermoplastic elastomer (B-1) comprising a monovinyl-substituted aromatic hydrocarbon and a conjugated diene, an ethylenically unsaturated compound (B-2), and a photopolymerization initiator (B-3); and
    a non-infrared ray-shielding layer (C) ablatable with an infrared ray, wherein
    the non-infrared ray-shielding layer (C) comprises a polymer (C-2) having carboxylate groups and ester bond groups in a molecule thereof and an infrared ray absorber (C-3),
    the ester bond groups contained in the polymer (C-2) have a saturated hydrocarbon chain of 2 to 8 carbon atoms, and
    the polymer (C-2) comprises a structure in which a carbon bonded to one of the carboxylate groups is adjacent to a carbon bonded to one of the ester bond groups, and a proportion of the adjacent bonds relative to all ester bond groups contained in the polymer (C-2) is 15% or more.

2. The photosensitive resin structure for the printing plate according to claim 1, wherein
    the polymer (C-2) comprises an aromatic hydrocarbon group.

3. The photosensitive resin structure for the printing plate according to claim 1, wherein
    the non-infrared ray-shielding layer (C) further comprises a polyamide resin (C-1).

4. The photosensitive resin structure for the printing plate according to claim 3, wherein
    a mass ratio of the polyamide resin (C-1) to the infrared ray absorber (C-3) is (C-1):(C-3)=1:0.15 to 2.

5. The photosensitive resin structure for the printing plate according to claim 3, wherein
    a mass ratio of the polyamide resin (C-1) to the polymer (C-2) is (C-1):(C-2)=1:0.001 to 1.

6. The photosensitive resin structure for the printing plate according to claim 1, wherein
    the photosensitive resin structure for the printing plate comprises a particle layer (D) between the non-infrared ray-shielding layer (C) and the photosensitive resin composition layer (B),
    the particle layer (D) comprises a particle having a pore structure, and
    the particle having a pore structure has a specific surface area of 350 m²/g or more and 1000 m²/g or less.

7. The photosensitive resin structure for the printing plate according to claim 1, wherein
    the photosensitive resin structure for the printing plate comprises an intermediate layer (E) between the non-infrared ray-shielding layer (C) and the photosensitive resin composition layer (B).

8. The photosensitive resin structure for the printing plate according to claim 7, wherein
    the intermediate layer (E) comprises a polyamide resin.

9. The photosensitive resin structure for the printing plate according to claim 8, wherein
    the polyamide resin is a water-soluble polyamide.

10. The photosensitive resin structure for the printing plate according to claim 7, wherein
    the intermediate layer (E) comprises a polyurethane.

11. The photosensitive resin structure for the printing plate according to claim 7, wherein
    the photopolymerization initiator (B-3) comprises at least one photopolymerization initiator having a structure represented by following formula (b-1) and at least one photopolymerization initiator having a structure represented by following formula (b-2):

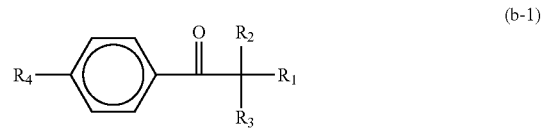

wherein $R_1$ to $R_4$ each independently represent one selected from the group consisting of a hydrogen atom, a hydrocarbon group having 1 to 10 carbon atoms, and a hetero group having 1 to 9 carbon atoms, the hetero group having 1 to 9 carbon atoms comprising any of an oxygen atom, a nitrogen atom, and a sulfur atom;

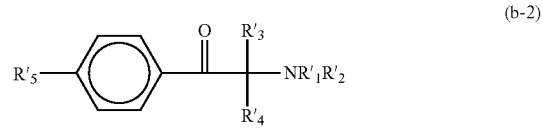

wherein $R'_1$ to $R'_5$ each independently represent one selected from the group consisting of a hydrogen atom, a hydrocarbon group having 1 to 10 carbon atoms, and a hetero group having 1 to 9 carbon atoms, the hetero group having 1 to 9 carbon atoms comprising any of an oxygen atom, a nitrogen atom, and a sulfur atom.

12. The photosensitive resin structure for the printing plate according to claim 11, wherein
    $R_1$ in the formula (b-1) represents a hydrocarbon group comprising an aromatic ring.

13. The photosensitive resin structure for the printing plate according to claim 11, wherein
    $R_2$ and/or $R_3$ in the formula (b-1) represents an alkoxy group.

14. The photosensitive resin structure for the printing plate according to claim 11, wherein
    $R'_5$ in the formula (b-2) represents a hetero functional group comprising a nitrogen atom or a sulfur atom.

15. The photosensitive resin structure for the printing plate according to claim 1, wherein a proportion of an area of the infrared ray absorber (C-3) in a section of the non-infrared ray-shielding layer (C) is 50% or more.

* * * * *